United States Patent
Takizawa et al.

(10) Patent No.: US 12,094,908 B2
(45) Date of Patent: Sep. 17, 2024

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventors: Masaaki Takizawa, Kanagawa (JP); Yorito Sakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 577 days.

(21) Appl. No.: 17/275,242

(22) PCT Filed: Aug. 6, 2019

(86) PCT No.: PCT/JP2019/030803
§ 371 (c)(1),
(2) Date: Mar. 11, 2021

(87) PCT Pub. No.: WO2020/059335
PCT Pub. Date: Mar. 26, 2020

(65) Prior Publication Data
US 2022/0037388 A1 Feb. 3, 2022

(30) Foreign Application Priority Data
Sep. 18, 2018 (JP) ................. 2018-174209

(51) Int. Cl.
*H01L 27/146* (2006.01)
*H01L 23/00* (2006.01)

(52) U.S. Cl.
CPC ........ *H01L 27/14634* (2013.01); *H01L 24/08* (2013.01); *H01L 24/80* (2013.01);
(Continued)

(58) Field of Classification Search
CPC ......... H01L 27/14603; H01L 27/14634; H01L 27/14636; H01L 27/1464; H01L 27/14643;
(Continued)

(56) References Cited

U.S. PATENT DOCUMENTS

2006/0007338 A1 * 1/2006 Wakano ............... H04N 25/772
348/E5.079
2009/0045319 A1 2/2009 Sugawa et al.
(Continued)

FOREIGN PATENT DOCUMENTS

CN 1722458 A 1/2006
CN 101164334 A 4/2008
(Continued)

OTHER PUBLICATIONS

International Search Report prepared by the Japan Patent Office on Oct. 10, 2019, for International Application No. PCT/JP2019/030803.

*Primary Examiner* — Marcos D. Pizarro
(74) *Attorney, Agent, or Firm* — Sheridan Ross PC

(57) ABSTRACT

A wide dynamic range with single exposure is achieved. A solid-state imaging device according to an embodiment includes a first substrate including a photoelectric conversion element, and a second substrate including a capacitor positioned on a side opposite to a surface of incidence of light to the photoelectric conversion element in the first substrate, and configured to accumulate a charge transferred from the photoelectric conversion element.

20 Claims, 18 Drawing Sheets

(52) U.S. Cl.
CPC .. *H01L 27/14603* (2013.01); *H01L 27/14621* (2013.01); *H01L 27/14627* (2013.01); *H01L 27/1463* (2013.01); *H01L 27/14636* (2013.01); *H01L 27/1464* (2013.01); *H01L 27/14645* (2013.01); *H01L 27/1469* (2013.01); *H01L 2224/08145* (2013.01); *H01L 2224/80895* (2013.01); *H01L 2224/80896* (2013.01)

(58) Field of Classification Search
CPC ........... H01L 27/14645; H01L 27/1469; H01L 2224/08145; H01L 2224/80895; H01L 2224/80896
See application file for complete search history.

(56) References Cited

U.S. PATENT DOCUMENTS

| | | |
|---|---|---|
| 2010/0238334 A1 | 9/2010 | Takahashi |
| 2014/0211056 A1 | 7/2014 | Fan |
| 2015/0060968 A1 | 3/2015 | Sa et al. |
| 2017/0078606 A1 | 3/2017 | Ohmaru |
| 2017/0134675 A1* | 5/2017 | Hynecek ............... H04N 25/771 |
| 2017/0230598 A1 | 8/2017 | Takayanagi |
| 2018/0240797 A1 | 8/2018 | Yokoyama et al. |

FOREIGN PATENT DOCUMENTS

| | | |
|---|---|---|
| CN | 102170533 A | 8/2011 |
| CN | 104425533 A | 3/2015 |
| CN | 105940493 A | 9/2016 |
| CN | 206301795 U | 7/2017 |
| CN | 107924873 A | 4/2018 |
| JP | 2006-245522 | 9/2006 |
| JP | 2010-219339 | 9/2010 |
| JP | 2015-050463 | 3/2015 |
| JP | 2016-511539 | 4/2016 |
| JP | 2017-216480 | 12/2017 |
| TW | 201628396 A | 8/2016 |
| WO | WO 2017/038403 | 3/2017 |

* cited by examiner

SOLID-STATE IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2019/030803 having an international filing date of 6 Aug. 2019, which designated the United States, which PCT application claimed the benefit of Japanese Patent Application No. 2018-174209, filed 18 Sep. 2018, the entire disclosures of each of which are incorporated herein by reference.

FIELD

This disclosure relates to a solid-state imaging device and an electronic device.

BACKGROUND

In a solid-state imaging device of a complementary metal oxide semiconductor (CMOS) type (hereinafter referred to as "CMOS image sensor" or simply referred to as "image sensor" or "solid-state imaging device"), a signal charge that has occurred in a photoelectric conversion unit (light receiving unit) is converted into a voltage in a floating diffusion capacitor (FD). The voltage obtained by conversion in the FD is read as an output voltage (also referred to as "pixel signal") via a source-follower circuit constructed by an amplification transistor.

CITATION LIST

Patent Literature

Patent Literature 1: Japanese Patent No. 5066704

SUMMARY

Technical Problem

An output voltage V of a pixel is given by $V=Q/C$ where C represents a signal detection capacity and Q represents a signal charge quantity that depends on a received light signal. Thus, recent microfabricated element structure cannot increase the signal detection capacity C due to a limitation on capacity per unit area of a capacitor element, which results in a difficulty in achieving a wide dynamic range with single exposure as required by an in-vehicle image sensor, for example.

In view of the above, this disclosure proposes a solid-state imaging device and an electronic device, which are capable of achieving a wide dynamic range with single exposure.

Solution to Problem

To solve the above-described problem, a solid-state imaging device according to one aspect of the present disclosure, comprises: a first substrate including a photoelectric conversion element; and a second substrate including a capacitor positioned on a side opposite to a surface of incidence of light to the photoelectric conversion element in the first substrate, and configured to accumulate a charge transferred from the photoelectric conversion element.

DESCRIPTION OF EMBODIMENTS

Figure 1:
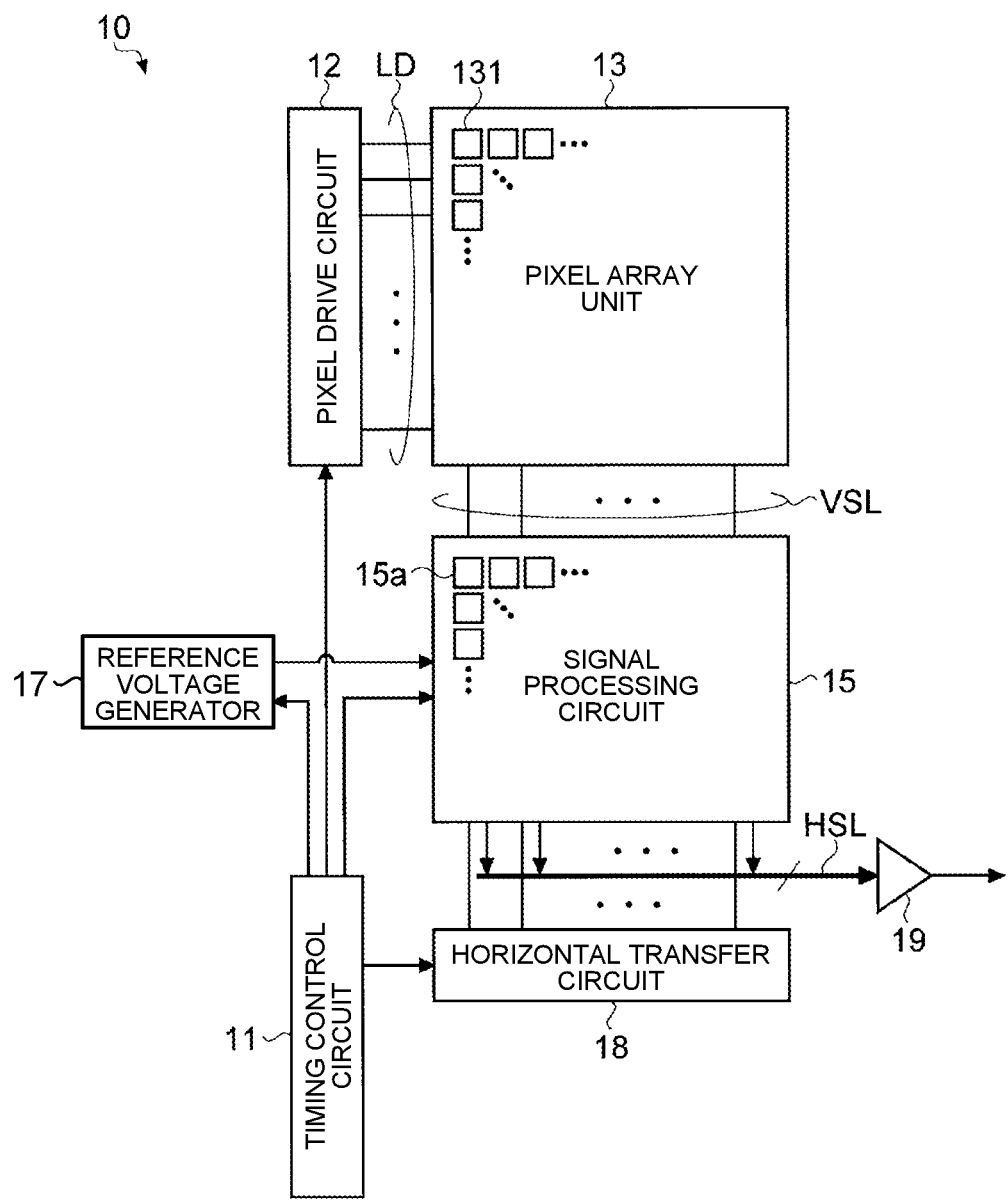
FIG. 1 is a block diagram illustrating an example of a schematic configuration of a solid-state imaging device according to a first embodiment.

Now, a description is given in detail of one embodiment of this disclosure with reference to the drawings. In the following embodiment, the same part is assigned with the same reference numeral, and a redundant description thereof is omitted.

This disclosure is described in accordance with the order of items given below.

1. First Embodiment
    1.1 Example of Schematic Configuration of Solid-state Imaging Device
    1.2 Example of Circuit Configuration of Unit Pixel
    1.3 Example of Basic Function of Unit Pixel
    1.4 Increase of Capacity per Unit Area
    1.5 Example of Cross-sectional Structure of Image Sensor
        1.5.1 Example of Structure of First Substrate
        1.5.2 Example of Structure of Second Substrate
        1.5.3 Example of Structure of Third Substrate
        1.5.4 Bonding of Substrates
    1.6 Example of Schematic Configuration of Unit Pixel
        1.6.1 Example of Layout of Unit Pixel
            1.6.1.1 Example of Layout of A-A Cross-section
            1.6.1.2 Example of Layout of B-B Cross-section
    1.7 Example of Production Process
    1.8 Action and Effect
2. Second Embodiment
    2.1 Example of Circuit Configuration of Shared Pixel
    2.2 Example of Schematic Configuration of Shared Pixel
        2.2.1 Example of Layout of Shared Pixel
            2.2.1.1 Example of Layout of A-A Cross-section
            2.2.1.2 Example of Layout of D-D Cross-section
    2.3 Action and Effect
3. Third Embodiment
    3.1 Example of Cross-sectional Structure of Image Sensor
    3.2 Example of Production Process
    3.3 Action and Effect 1. First Embodiment First, a description is given in detail of a solid-state imaging device and an electronic device according to a first embodiment with reference to the drawings.

1.1 Example of Schematic Configuration of Solid-State Imaging Device

FIG. 1 is a block diagram illustrating an example of a schematic configuration of a CMOS solid-state imaging device (hereinafter simply referred to as "image sensor") according to the first embodiment. As illustrated in FIG. 1, an image sensor 10 according to this embodiment includes a pixel array unit 13, a signal processing circuit 15, a reference voltage generator 17, and an output circuit 19.

A drive control unit for sequentially reading an analog pixel signal from each unit pixel 131 and outputting digital image data is provided outside of the pixel array unit 13. This drive control unit may include, for example, a horizontal transfer circuit 18, a pixel drive circuit 12, and a timing control circuit 11.

The pixel array unit 13 includes the plurality of unit pixels 131, which are arranged in a two-dimensional matrix form in row and column directions. In FIG. 1, for the simplicity of description, a part of rows and columns of the pixel array unit 13 is omitted. However, several tens to thousands of unit pixels 131 may be arranged in each row and each column, for example.

Each unit pixel 131 is connected to the pixel drive circuit 12 via a pixel drive line LD for selecting a pixel, and is connected to an AD conversion circuit 15a described later via a vertical signal line VSL on a one-to-one basis. In this description, the pixel drive line LD indicates wiring in general extending from the pixel drive circuit 12 to each unit pixel 131. For example, the pixel drive line LD may include a control line that transmits various kinds of pulse signals (e.g., pixel reset pulse, transfer pulse, and drain line control pulse) for driving the unit pixel 131.

The signal processing circuit 15 includes an analog circuit such as an analog-to-digital (AD) conversion circuit 15a configured to convert an analog pixel signal read from the unit pixel 131 into a digital pixel signal, and a logic circuit configured to execute digital processing such as correlated double sampling (CDS) processing based on the pixel signal converted into a digital value by the AD conversion circuit 15a. The AD conversion circuit 15a may be provided for each unit pixel 131 on a one-to-one basis, or for each pixel group formed of the plurality of unit pixels 131 on a one-to-one basis, or for each column in the pixel array unit 13 on a one-to-one basis, for example. FIG. 1 illustrates a configuration in which the plurality of AD conversion circuits 15a are arranged in a two-dimensional matrix form in row and column directions. However, the configuration is not limited thereto.

Each AD conversion circuit 15a executes AD conversion of converting a reset level, which is a reference level of a pixel signal, and a signal level, which depends on a received light amount, into pieces of digital data separately, for example. Each AD conversion circuit 15a also executes difference processing (corresponding to correlated double sampling (CDS) processing) of acquiring a digital pixel signal of a signal component that depends on the received light amount. In this CDS processing, processing of calculating a difference between the result of AD conversion of the reset level and the result of AD conversion of the signal level is executed. The AD conversion circuit 15a may be a single slope AD conversion circuit, or a successive approximation register (SAR) AD conversion circuit, for example.

The reference voltage generator 17 supplies, to the signal processing circuit 15, a reference voltage REF for converting an analog pixel signal read from each unit pixel 131 via the vertical signal line VSL into a digital pixel signal. For example, when the AD conversion circuit 15a is a single slope AD conversion circuit, the reference voltage generator 17 outputs the reference voltage REF having a sawtooth (also called "ramp") waveform that increases or decreases in a linear or stepwise manner. Meanwhile, when the AD conversion circuit 15a is a successive approximation register AD conversion circuit, the reference voltage generator 17 outputs the reference voltage REF having a fixed voltage value. In that case, each AD conversion circuit 15a generates a plurality of reference voltages to be used for successive approximation by dividing the reference voltage REF being a fixed voltage, for example.

The timing control circuit 11 outputs, for example, an internal clock necessary for operation of each unit or a pulse signal representing a timing at which each unit starts to perform operation. The timing control circuit 11 receives data indicating, for example, a master clock or an operation mode from the outside, or outputs data including information of the image sensor 10.

For example, the timing control circuit 11 outputs, to the pixel drive circuit 12, a pulse signal representing a timing of reading a pixel signal from each unit pixel 131. The timing control circuit 11 outputs, to the horizontal transfer circuit 18, a column address signal for sequentially reading, from the signal processing circuit 15 for each column, a pixel signal (digital voltage value) of a signal component subjected to AD conversion by the AD conversion circuit 15a.

The timing control circuit 11 supplies, for example, a clock of the same frequency as that of the master clock input from the outside, a half-frequency clock thereof, or a low-speed clock obtained by further dividing the half-frequency clock, to each unit inside the image sensor 10 such as the horizontal transfer circuit 18, the pixel drive circuit 12, or the signal processing circuit 15 as an internal clock. Clocks in general, which include the half-frequency clock and other clocks obtained by further dividing the half-frequency clock, are hereinafter collectively referred to as "low-speed clock".

The pixel drive circuit 12 selects a row of the pixel array unit 13, and outputs a pulse necessary to drive that row to the pixel drive line LD. For example, the pixel drive circuit 12 includes a vertical decoder configured to specify a row to be read in a vertical direction (select row of pixel array unit 13), and a vertical drive unit configured to supply a pulse to the pixel drive line LD corresponding to the unit pixel 131 on a read address (in row direction) specified by the vertical decoder and drive the unit pixel 131. The vertical decoder also selects, for example, a row for an electronic shutter in addition to the row for reading a pixel signal.

The horizontal transfer circuit 18 uses a column address signal input from the timing control circuit 11 to execute a shift operation (scanning) of reading a digital pixel signal into a horizontal signal line HSL from each AD conversion circuit 15a of a column to be read, which is specified by the column address signal.

The output circuit 19 outputs the digital pixel signal read from the horizontal transfer circuit 18 to the outside as image data.

The signal processing circuit 15 may include, for example, an auto gain control (AGC) circuit having a signal amplification function as necessary.

As an example of a high-speed clock generation unit, a clock conversion unit configured to generate a pulse of a clock frequency higher than an input clock frequency may be provided in the image sensor 10. In that case, the timing control circuit 11 may generate an internal clock based on the clock (e.g., master clock) input from the outside or the high-speed clock generated by the clock conversion unit.

1.2 Example of Circuit Configuration of Unit Pixel

Next, a description is given of an example of a circuit configuration of the unit pixel 131 arranged in a matrix form in the pixel array unit 13 of FIG. 1.

Figure 2:
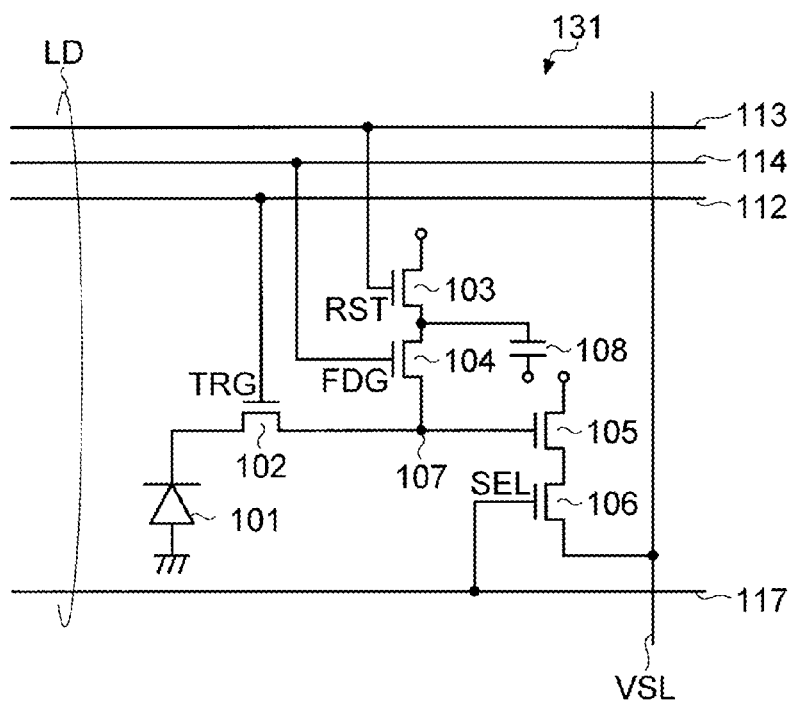
FIG. 2 is a circuit diagram illustrating an example of a schematic configuration of a unit pixel of an effective pixel region according to the first embodiment.

FIG. 2 is a circuit diagram illustrating an example of a schematic configuration of a unit pixel of an effective pixel region according to this embodiment. As illustrated in FIG. 2, the unit pixel 131 includes a photodiode 101, a transfer transistor 102, a reset transistor 103, a switch transistor 104, an amplification transistor 105, a selection transistor 106, a node 107 functioning as a first floating diffusion, a capacitor 108 functioning as a second floating diffusion, a selection transistor drive line 117 serving as the pixel drive line LD with one end connected to the pixel drive circuit 12, a reset transistor drive line 113, a switch transistor drive line 114, a transfer transistor drive line 112, and the vertical signal line VSL with one end connected to the signal processing circuit 15.

The photodiode 101 is configured to photoelectrically convert incident light. The transfer transistor 102 is configured to transfer a charge that has occurred in the photodiode 101. The node 107 functioning as the first floating diffusion and the capacitor 108 functioning as the second floating diffusion are configured to accumulate the charge transferred by the transfer transistor 102. The switch transistor 104 is configured to control accumulation of a charge by the capacitor 108. The amplification transistor 105 causes, in the vertical signal line VSL, a voltage pixel signal that depends on the charge accumulated in the node 107 or the node 107 and the capacitor 108. The reset transistor 103 discharges the charge accumulated in the node 107 or the node and the capacitor 108. The selection transistor 106 selects the unit pixel 131 to be read.

The anode of the photodiode 101 is connected to the ground, and the cathode of the photodiode 101 is connected to the source of the transfer transistor 102. The drain of the transfer transistor 102 is connected to the source of the switch transistor 104 and the gate of the amplification transistor 105, and the node 107 serving as a connection point forms the first floating diffusion.

The reset transistor 103 and the switch transistor 104 are arranged in series to the node 107. The drain of the reset transistor 103 is connected to a vertical reset input line, which is not shown.

The source of the amplification transistor 105 is connected to a vertical current supply line, which is not shown. The drain of the amplification transistor 105 is connected to the source of the selection transistor 106, and the drain of the selection transistor 106 is connected to the vertical signal line VSL.

The gate of the transfer transistor 102, the gate of the reset transistor 103, the gate of the switch transistor 104, and the gate of the selection transistor 106 are each connected to the pixel drive circuit 12 via a pixel drive line LV, and are each supplied with a pulse serving as a drive signal.

The node 107 functioning as the first floating diffusion and the capacitor 108 functioning as the second floating diffusion convert the accumulated charge into a voltage of a voltage value that depends on the charge quantity. The first floating diffusion is, for example, a floating diffusion region, and is a ground capacity between the node 107 and the ground. However, the first floating diffusion is not limited thereto, and the first floating diffusion may be a capacity that is intentionally added by connecting a capacitor or the like to the node 107.

The capacitor 108 functioning as the second floating diffusion converts the accumulated charge into a voltage of a voltage value that depends on the charge quantity.

1.3 Example of Basic Function of Unit Pixel

Next, a description is given of a basic function of the unit pixel 131. The reset transistor 103 functions when a switch signal FDG applied to the gate of the switch transistor 104 is constantly in a high state, and turns on/off of discharge of the charge accumulated in the node 107 and the capacitor 108 in accordance with a reset signal RST supplied from the pixel drive circuit 12.

When the reset signal RST at a high level is input to the gate of the reset transistor 103, the node 107 and the capacitor 108 are clamped to a voltage input via a vertical reset input line. As a result, the charge accumulated in the node 107 and the capacitor 108 is discharged (reset).

When the reset signal RST at a low level is input to the gate of the reset transistor 103, the node 107 and the capacitor 108 are electrically disconnected from the vertical reset input line, and are set to a floating state.

The switch transistor 104 functions when the reset signal RST is constantly in a high state, and turns on/off of discharge of the charge accumulated in the node 107 in accordance with the switch signal FDG supplied from the pixel drive circuit 12.

When the switch signal FDG at a high level is input to the gate of the switch transistor 104, the node 107 is clamped to a voltage applied via the vertical reset input line. As a result, the charge accumulated in the node 107 is discharged (reset).

When the switch signal FDG at a low level is input to the gate of the switch transistor 104, the node 107 is electrically disconnected from the vertical reset input line, and is set to a floating state.

The photodiode 101 photoelectrically converts incident light, and generates a charge that depends on the light amount. The generated charge is accumulated on the cathode side of the photodiode 101. The transfer transistor 102 turns on/off of transfer of a charge from the photodiode 101 to the node 107 or the node 107 and the capacitor 108 in accordance with a transfer control signal TRG supplied from the pixel drive circuit 12.

For example, when the transfer control signal TRG at a high level is input to the gate of the transfer transistor 102, the charge accumulated in the photodiode 101 is transferred to the node 107 or the node 107 and the capacitor 108. Meanwhile, when the transfer control signal TRG at a low level is supplied to the gate of the transfer transistor 102, transfer of a charge from the photodiode 101 is stopped.

The photoelectrically converted charge is accumulated in the photodiode 101 while the transfer transistor 102 is stopping transfer of a charge to the node 107 or the node 107 and the capacitor 108.

As described above, the node 107 and the capacitor 108 each have a function of accumulating a charge transferred from the photodiode 101 via the transfer transistor 102 and converting the charge into a voltage. Therefore, under a floating state in which the reset transistor 103 and/or the switch transistor 104 is off, the voltage of the node 107 or the node 107 and the capacitor 108 is modulated in accordance with the charge quantity accumulated in each of the node 107 and the capacitor 108.

The amplification transistor 105 functions as an amplifier configured to receive a voltage variation of the node 107 or the node 107 and the capacitor 108 connected to the gate as an input signal, and an output voltage signal thereof is output to the vertical signal line VSL via the selection transistor 106 as a pixel signal.

The selection transistor 106 turns on/off of output of a voltage signal from the amplification transistor 105 to the vertical signal line VSL in accordance with a selection control signal SEL supplied from the pixel drive circuit 12. For example, when the selection control signal SEL at a high level is input to the gate of the selection transistor 106, a voltage signal is output to the vertical signal line VSL from the amplification transistor 105. Meanwhile, when the selection control signal SEL at a low level is input to the gate of the selection transistor 106, output of a voltage signal from the amplification transistor 105 to the vertical signal line VSL is stopped. As a result, the vertical signal line VSL to which the plurality of unit pixels 131 are connected enables retrieval of only the output from the selected unit pixel 131.

In this manner, the unit pixel 131 is driven in accordance with the transfer control signal TRG, the reset signal RST, the switch signal FDG, and the selection control signal SEL supplied from the pixel drive circuit 12.

1.4 Increase of Capacity Per Unit Area

In the configuration of the unit pixel 131 as described above, for example, it is conceivable to adopt, as the capacitor 108 functioning as the second floating diffusion, what is called a trench capacitor that forms a vertical capacitor on a trench formed on the semiconductor substrate in order to increase the capacity per unit area. Also when a capacitor is added to the node 107, it is conceivable to adopt a trench capacitor as a capacitor to be added in order to increase the capacity per unit area.

When the trench capacitor is formed on the same semiconductor substrate as that of the photodiode 101, for example, it is necessary to set a layout in which the photodiode 101 and the trench capacitor are arranged in the horizontal direction, or a layout in which the photodiode 101 and the trench capacitor are arranged in the vertical direction. In the former case, for example, there is a problem in that pixel integration deteriorates due to increase in area of each unit pixel 131. In the latter case, for example, there is a problem in that ion implantation to a deeper position is required to form the photodiode 101, or a signal is required to be read from the photodiode 101 formed at a deep position.

In view of the above, this embodiment adopts a configuration in which a trench capacitor is formed on a substrate separate from a substrate on which the photodiode 101 is formed, and those substrates are bonded to each other. As a result, it is possible to achieve a wide dynamic range with single exposure by increasing the capacity per unit area while at the same time avoiding occurrence of problems such as deterioration in pixel integration, ion implantation to a deeper position, or read out of a signal from a deep position.

1.5 Example of Cross-Sectional Structure of Image Sensor

Figure 3:
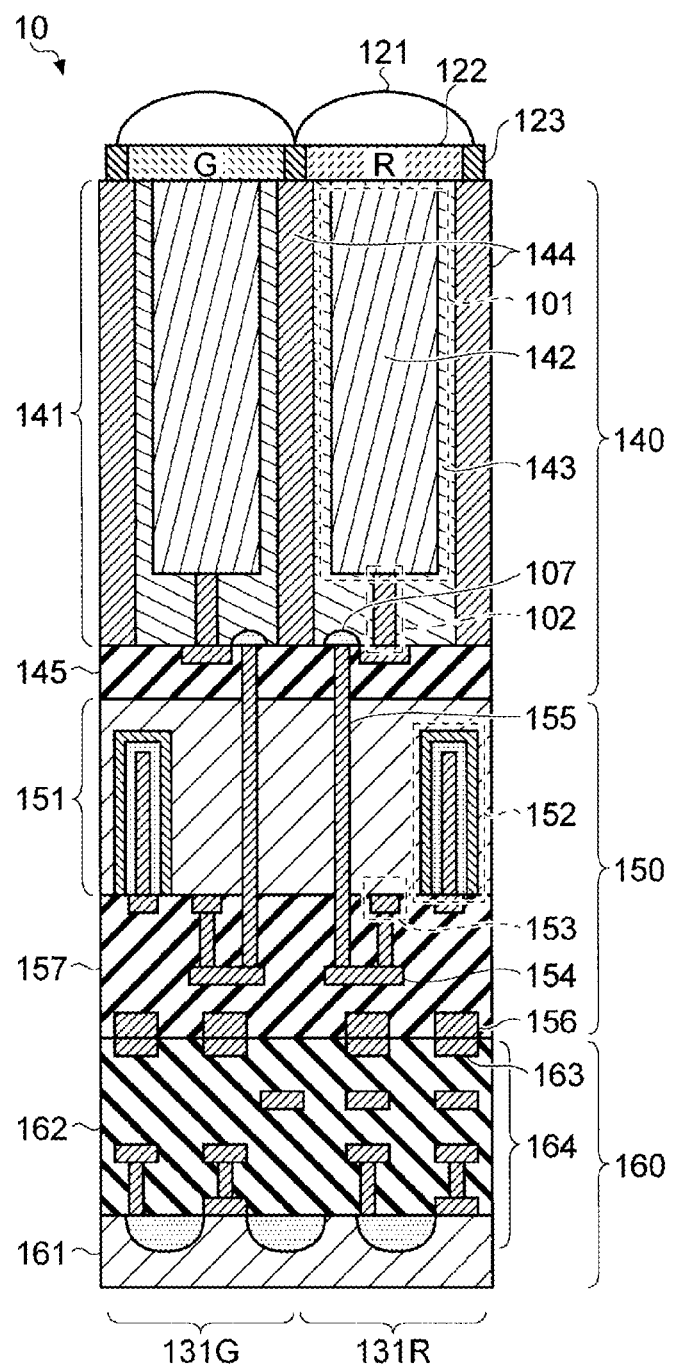
FIG. 3 is a cross-sectional diagram illustrating an example of cross-sectional structure of an image sensor according to the first embodiment.

FIG. 3 is a cross-sectional diagram illustrating an example of cross-sectional structure of the image sensor according to this embodiment. In FIG. 3, the side of incidence of light is set as an upper side, and cross-sectional structure of a surface parallel to the direction of incidence of light is illustrated. In FIG. 3, unit pixels 131G and 131R, which receive light of green G and red R among three primary colors of RGB, are illustrated. However, the configuration is not limited thereto. In the following description, the unit pixel 131 for each color is not distinguished and is assigned with a reference numeral 131 for the sake of simplicity of description.

As illustrated in FIG. 3, the image sensor 10 has laminate structure in which a first substrate 140, a second substrate 150, and a third substrate 160 are bonded to one another. In this laminate structure, the unit pixel 131 is formed across the first substrate 140 and the second substrate 150, for example.

1.5.1 Example of Structure of First Substrate

The photodiode 101 and the transfer transistor 102 are provided on the first substrate 140. The photodiode 101 is configured to receive light incident from the side of a back surface (upper surface in FIG. 3) of a semiconductor substrate 141. A color filter 122 and an on-chip lens 121 are provided above the photodiode 101. A light-shielding film 123 may be provided between the adjacent color filters 122 in order to prevent crosstalk of light between the adjacent unit pixels 131. A flattening film (not shown) for flattening a surface for connecting the color filter 122 to the ground may be provided between the semiconductor substrate 141 and the color filter 122.

In the photodiode 101, for example, an n-type semiconductor region 142 is formed as a charge accumulation region for accumulating a charge (electron). In the photodiode 101, the n-type semiconductor region 142 is provided inside a p-type semiconductor region 143 of the semiconductor substrate 141.

In the p-type semiconductor region 143, an impurity concentration of a region on the side of a surface (lower surface) of the semiconductor substrate 141 may be higher than an impurity concentration of a region on the side of the back surface (upper surface). In other words, the photodiode 101 may have hole-accumulation diode (HAD) structure.

With such a configuration, it is possible to suppress occurrence of a dark current in each boundary between the upper surface side and the lower surface side of the n-type semiconductor region 142.

A pixel separation unit 144 configured to separate the adjacent photodiodes 101 optically and electrically is provided inside the semiconductor substrate 141 in order to prevent crosstalk between the photodiodes 101. In FIG. 3, when the image sensor 10 is viewed from the upper surface side, the pixel separation unit 144 is formed to have a lattice shape so as to be interposed between the adjacent unit pixels 131, for example. The photodiode 101 is formed within a region separated by the pixel separation unit 144.

The anode of the photodiode 101 is connected to the ground. A signal charge (e.g., electron) accumulated in the photodiode 101 is transferred to the node 107 via the transfer transistor 102 connected to the cathode.

The node 107 functioning as the first floating diffusion applies the voltage of a voltage value that depends on the quantity of the transferred charge to the gate of the amplification transistor 105 in a pixel transistor 153 provided in the second substrate 150 via a through silicon via (TSV) 155. The pixel transistor 153 may include the reset transistor 103, the switch transistor 104, and the selection transistor 106 in addition to the amplification transistor 105.

An insulation film 145 is provided on a surface (lower surface) of the semiconductor substrate 141 opposite to the back surface (upper surface) on which the color filter 122 and the on-chip lens 121 are provided. As a result, the semiconductor substrate 141 of the first substrate 140 and a semiconductor substrate 151 of the second substrate 150 are electrically separated from each other. The upper surface of the insulation film 145 is flattened to be bonded to the second substrate 150.

1.5.2 Example of Structure of Second Substrate

A capacitor 152 is provided on the second substrate 150. The capacitor 152 may be, for example, a trench capacitor. However, the capacitor 152 is not limited thereto, and various kinds of capacitors can be adopted as the capacitor 152. In the following description, a description is given of a case in which the capacitor 152 is a trench capacitor.

The trench capacitor 152 may be the capacitor 108 functioning as the second floating diffusion, or may be a capacitor intentionally added to the node 107. In the following description, an example of setting the trench capacitor 152 as the capacitor 108 is described.

The trench capacitor 152 is formed in a trench engraved on the surface (lower surface) of the semiconductor substrate 151 opposite to the back surface (upper surface) bonded to the first substrate 140, for example.

The drain of the transfer transistor 102 in the first substrate 140 is connected to the pixel transistor 153 via a TSV 155, which penetrates the insulation film 145 of the first substrate 140 into the middle of an insulation film 157 via the semiconductor substrate 151 of the second substrate, and a wiring 154 formed in the insulation film 157. The pixel transistor 153 and the trench capacitor 152 are electrically connected to each other via a wiring or the like, which is not shown.

For example, a copper (cu) electrode pad 156 is formed on the surface (lower surface) of the insulation film 157 provided on the surface (lower surface) of the semiconductor substrate 151. This electrode pad 156 functions as a connection point (Cu—Cu bonding) that mechanically bonds the second substrate 150 and the third substrate 160 to each other while at the same time electrically connecting the second substrate 150 and the third substrate 160 to each other.

1.5.3 Example of Structure of Third Substrate

A circuit element 164 such as the signal processing circuit 15 in FIG. 1 is provided on the third substrate 160. The circuit element 164 may include, for example, the timing control circuit 11, the pixel drive circuit 12, the horizontal transfer circuit 18, the reference voltage generator 17, and the output circuit 19 in addition to the signal processing circuit 15.

The circuit element 164 is formed on a semiconductor substrate 161 and an insulation film 162 provided on the surface (upper surface) of the semiconductor substrate 161. The copper (Cu) electrode pad 156 for electrically and mechanically connecting to the electrode pad 156 of the second substrate 150 is formed on the upper surface of the insulation film 162.

1.5.4 Bonding of Substrates

In the configuration as described above, the first substrate 140 and the second substrate 150 are bonded to each other by what is called direct bonding of flattening respective bonded surfaces of the first substrate 140 and the second substrate 150 and bonding those bonded surfaces to each other by atomic force. Meanwhile, as described above, the second substrate 150 and the third substrate 160 are bonded to each other by what is called Cu—Cu bonding of bonding copper (Cu) electrode pads 156 and 163 formed on the respective bonded surfaces to each other. However, the bonding method is not limited thereto, and various kinds of bonding methods may be used.

1.6 Example of Schematic Configuration of Unit Pixel

Figure 4:
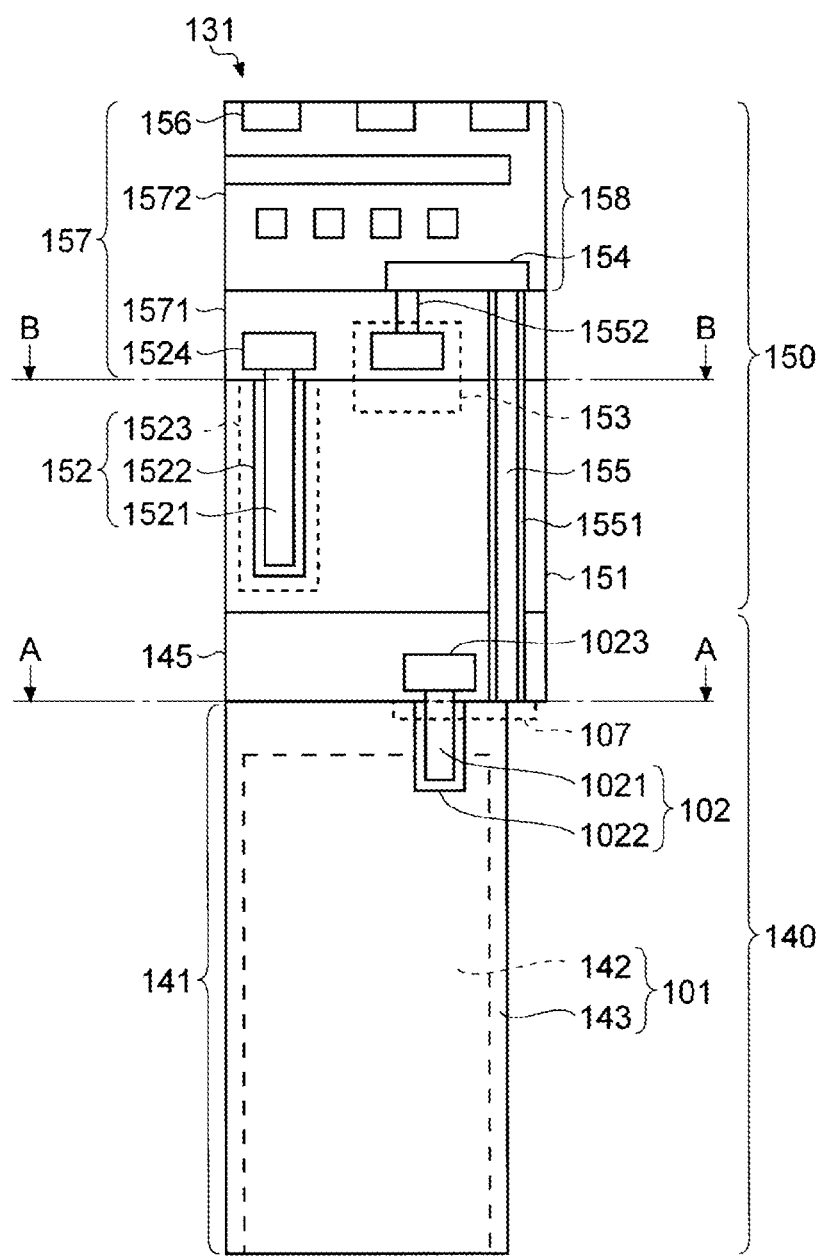
FIG. 4 is a cross-sectional diagram illustrating an example of cross-sectional structure of a unit pixel according to the first embodiment.

Next, a description is given of cross-sectional structure of the unit pixel 131 in the example of the cross-sectional structure illustrated in FIG. 3 more in detail. FIG. 4 is a cross-sectional diagram illustrating an example of the cross-sectional structure of a unit pixel according to this embodiment. In FIG. 4, contrary to FIG. 3, light enters the photodiode 101 from the lower side of FIG. 4. In FIG. 4, hatching of each unit is omitted in consideration of visibility.

As illustrated in FIG. 4, the unit pixel 131 has structure in which the photodiode 101 and the transfer transistor 102 are provided on the first substrate 140, and the trench capacitor 152 and the pixel transistor 153 are provided on the second substrate 150. The node 107 in the unit pixel 131 is arranged on the first substrate 140.

The transfer transistor 102 includes a transfer gate 1021 and a gate insulation film 1022, and transfers a charge that has occurred in the photodiode 101 to the node 107 being the first floating diffusion. A transfer transistor electrode 1023 to which the transfer control signal TRG is input is connected to the transfer gate 1021.

The TSV 155 is in contact with and electrically connected to the node 107. An in-hole insulation film 1551 for preventing the TSV 155 and the semiconductor substrate 151 from electrically connecting to each other is provided on the side of the TSV 155.

The TSV 155 is in contact with and electrically connected to the wiring 154 formed on the upper surface of a first insulation film 1571 by penetrating the insulation film 145, the semiconductor substrate 151, and the first insulation film 1571 on the lower side of the insulation film 157.

A connected electrode 1552, which is connected to the pixel transistor 153, is also electrically connected to the wiring 154.

As described above, the trench capacitor 152 is provided on the semiconductor substrate 151. The trench capacitor 152 is formed of a lower electrode 1523, which is formed on the inner surface of a trench formed by engraving the semiconductor substrate 151 from the surface side in a vertical direction, an insulation film 1522 formed to cover the surface of the lower electrode 1523, and an upper electrode 1521 formed to fill in the trench formed by the insulation film 1522. The upper electrode 1521 is electrically connected to the pixel transistor 153 via a trench capacitor electrode 1524 on the upper side of the upper electrode 1521 and a wiring, which is not shown, for example.

A multi-wiring layer 158 including a wiring formed on a second insulation film 1572 is stacked on the upper surface of the first insulation film 1571. As described above, the copper (Cu) electrode pad 156 for electrically and mechanically connecting to the copper (Cu) electrode pad 163 provided on the third substrate 160 is provided on the upper surface of the multi-wiring layer 158. This electrode pad 156 is electrically connected to the pixel transistor 153 through wiring inside the multi-wiring layer 158.

1.6.1 Example of Layout of Unit Pixel

Now, a description is given in detail of a layout of each of an A-A cross-section and a B-B cross-section in FIG. 4 with reference to the drawings. The A-A cross-section corresponds to a boundary surface between the semiconductor substrate 141 and the insulation film 145 in the first substrate 140. The B-B cross-section corresponds to a boundary surface between the semiconductor substrate 151 and the first insulation film 1571 in the second substrate 150.

1.6.1.1 Example of Layout of A-A Cross-Section

Figure 5:
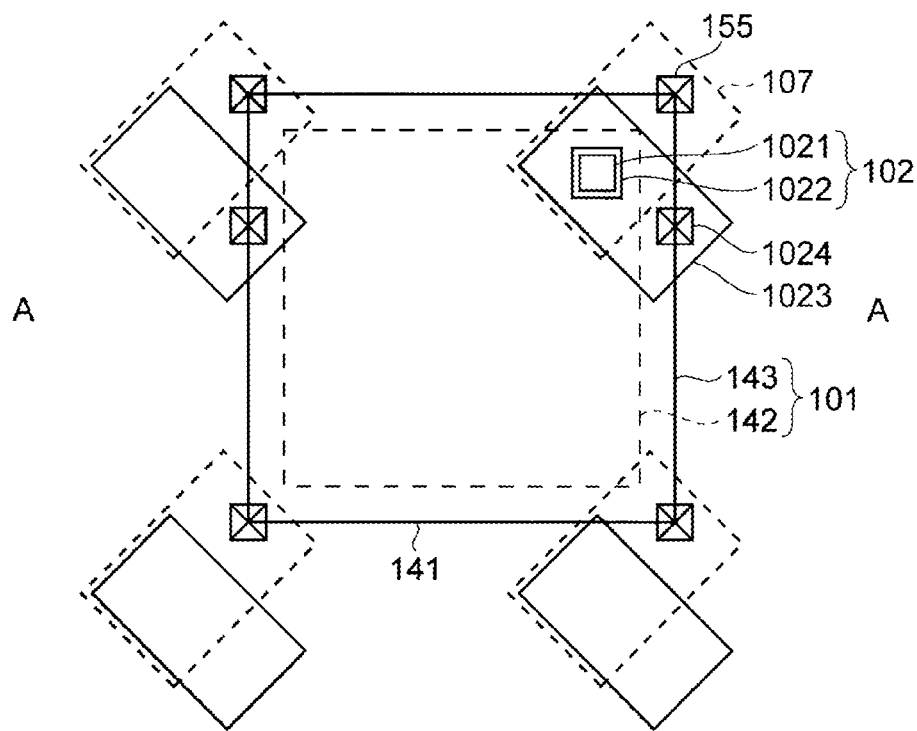
FIG. 5 is a diagram illustrating an example of a layout of an A-A cross-section in FIG. 3.

FIG. 5 is a diagram illustrating an example of the layout of the A-A cross-section in FIG. 3. In FIG. 5, for the sake of convenience of description, a configuration that does not appear in the A-A cross-section is also illustrated.

As illustrated in FIG. 5, the photodiode 101 is formed of the n-type semiconductor region 142, which is formed substantially at the center of a square region assigned to each unit pixel 131 in the semiconductor substrate 141, and the p-type semiconductor region 143 surrounding the n-type semiconductor region 142, for example. The transfer gate 1021 covered by the gate insulation film 1022 (refer to FIG. 4) is embedded into the n-type semiconductor region 142.

The transfer transistor electrode 1023 on the upper side of the transfer gate 1021 is connected to the transfer transistor drive line 112 (refer to FIG. 2) via a wiring including an electrode 1024, which is not shown in FIG. 4. The transfer gate 1021 is connected to the TSV 155 via the node 107. The TSV 155 is arranged at a corner of the square region assigned to each unit pixel 131, for example.

1.6.1.2 Example of Layout of B-B Cross-Section

Figure 6:
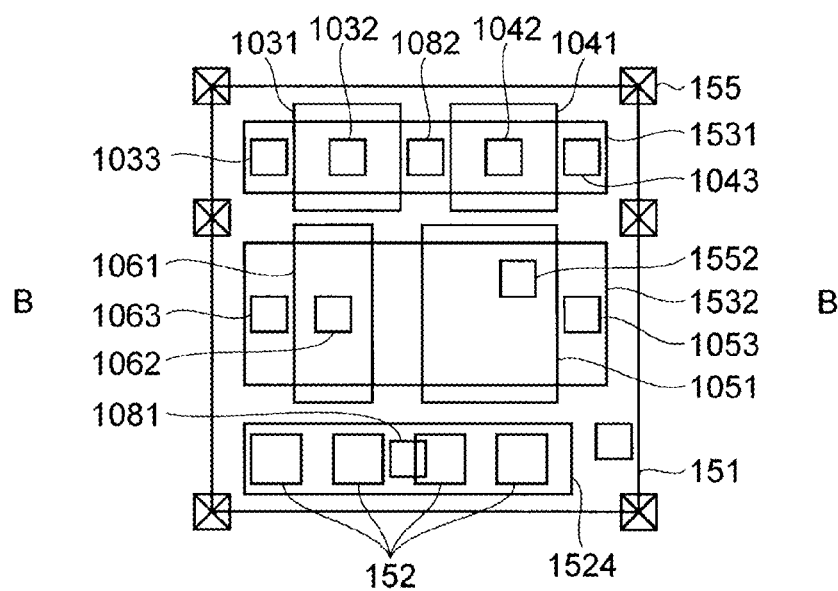
FIG. 6 is a diagram illustrating an example of a layout of a B-B cross-section in FIG. 3.

FIG. 6 is a diagram illustrating an example of the layout of the B-B cross-section in FIG. 3. In FIG. 6, for the sake of convenience of description, a configuration that does not appear in the B-B cross-section is also illustrated.

As illustrated in FIG. 6, activation regions 1531 and 1532 doped with a predetermined impurity are formed on the square region assigned to each unit pixel 131 in the semiconductor substrate 151.

A reset gate 1031 of the reset transistor 103 and a switch gate 1041 of the switch transistor 104 are provided in one activation region 1531 via a gate insulation film, which is not shown. In such a configuration, the drain of the switch transistor 104 and the source of the reset transistor 103 are used in common.

The switch gate 1041 is connected to the switch transistor drive line 114 (refer to FIG. 2) via the wiring including the electrode 1024, which is not shown in FIG. 4. The source of the switch transistor 14 is connected to the TSV 155 extending from the first substrate 140 via a wiring including an electrode 1043, which is not shown in FIG. 4. The TSV 155 is also connected to an amplification gate 1051 via the wiring 154 (refer to FIG. 4) and the connected electrode 1552.

The reset gate 1031 is connected to the reset transistor drive line 113 (refer to FIG. 2) via a wiring including an electrode 1032, which is not shown in FIG. 4. The drain of the reset transistor 103 is connected to the vertical reset input line, which is not shown, via a wiring including an electrode 1033, which is not shown in FIG. 4.

The amplification gate 1051 of the amplification transistor 105 and a selection gate 1061 of the selection transistor 106 are provided in the other activation region 1532 via a gate insulation film, which is not shown. In such a configuration, the drain of the amplification transistor 105 and the source of the selection transistor 106 are used in common.

The source of the amplification transistor 105 is connected to a vertical current supply line, which is not shown, via a wiring including an electrode 1053, which is not shown in FIG. 4.

The selection gate 1061 is connected to the selection transistor drive line 117 (refer to FIG. 2) via a wiring including an electrode 1062, which is not shown in FIG. 4. The drain of the selection transistor 106 is connected to the vertical signal line VSL via a wiring including an electrode 1063, which is not shown in FIG. 4.

The trench capacitor 152 is provided in each of one or more (four in FIG. 6) trenches formed on the semiconductor substrate 151 in the square region assigned to each unit pixel 131 in the semiconductor substrate 151. The upper part of the upper electrode 1521 in each of the plurality of trench capacitors 152 forms the trench capacitor electrode 1524 to be used in common. In short, the plurality of trench capacitors 152 are connected in parallel to one another.

The trench capacitor electrode 1524 is connected to a node to be used in common as the drain of the switch transistor 104 and the source of the reset transistor 103 via a wiring including electrodes 1081 and 1082, which is not shown in FIG. 4 (corresponding to capacitor 108 in FIG. 2).

1.7 Example of Production Process

Next, a description is given in detail of a method of producing the image sensor 10 according to this embodiment with reference to the drawings. FIG. 7 to FIG. 10 are process cross-sectional diagrams for describing the method of producing the image sensor according to this embodiment.

Figure 7:
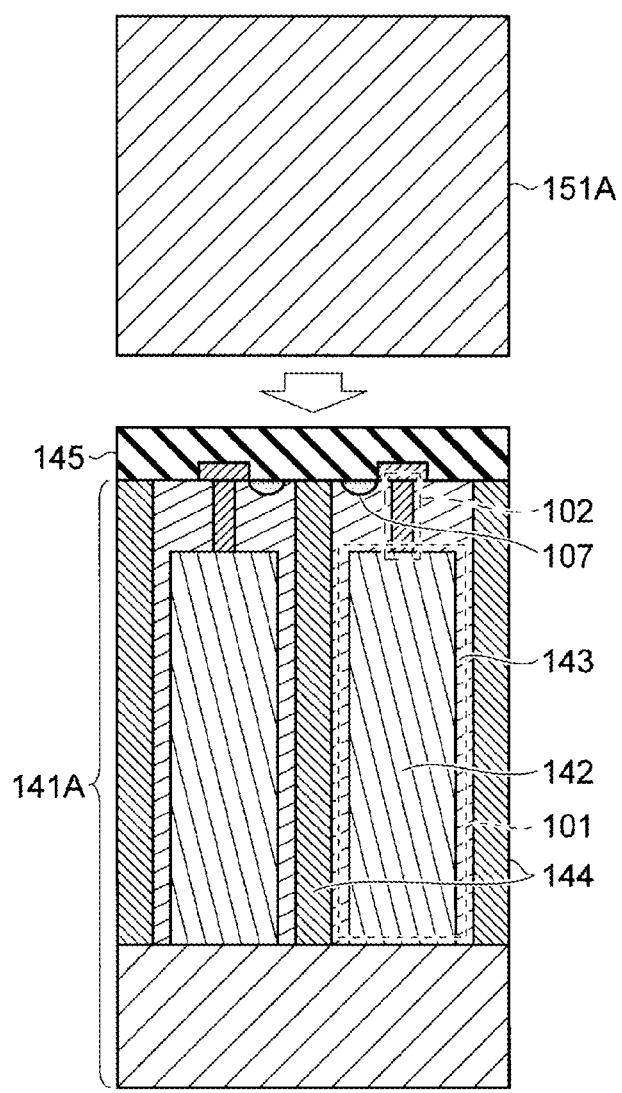
FIG. 7 is a process cross-sectional diagram for describing a method of producing the image sensor according to the first embodiment (part 1).

In this production method, as illustrated in FIG. 7, first, the p-type semiconductor region 143 is formed by injecting, into a semiconductor substrate 141A before thinning, a dopant such as boron or aluminum serving as an acceptor from the surface (upper surface) side of the semiconductor substrate 141A by using a predetermined ion implantation method, for example.

Next, the n-type semiconductor region 142 for each unit pixel 131 is formed by forming a predetermined mask pattern on the upper surface of the semiconductor substrate 141A and injecting a dopant such as phosphorus or arsenic serving as a donor into the predetermined mask pattern by using a predetermined ion implantation method. The n-type semiconductor region 142 is formed in a region that is deep in the upper surface of the semiconductor substrate 141A to some extent. The mask pattern used for forming the n-type semiconductor region 142 is removed after that.

The pixel separation unit 144 separating the region of forming each photodiode 101 may be formed on the semiconductor substrate 141A by using a predetermined production process before formation of the p-type semiconductor region 143, or may be formed on the semiconductor substrate 141A by using a predetermined production process after formation of the p-type semiconductor region 143 or after formation of the n-type semiconductor region 142.

Next, a trench that extends from the upper surface of the semiconductor substrate 141 to the n-type semiconductor region 142 is formed by photolithography and etching, for example, and the transfer transistor 102 including the gate insulation film 1022 and the transfer gate 1021 is formed in the trench.

Next, the node 107 being a floating diffusion region is formed on the upper surface side of the semiconductor substrate 141 by an ion implantation method, for example. Then, after an electrode such as the transfer transistor electrode 1023 and a wiring are formed by using a lift-off technology or pattern etching, for example, the insulation film 145 covering the upper surface of the semiconductor substrate 141 is formed by using a chemical vapor deposition (CVD) method (including plasma CVD method, which holds true below) or a sputtering method, for example. Then, the upper surface of the formed insulation film 145 is flattened by using a chemical mechanical polishing (CMP) method, for example.

A semiconductor substrate 151A having a bonded surface (back surface) flattened similarly by using a CMP method or the like is bonded to the flattened upper surface of the insulation film 145. As described above, the insulation film 145 and the semiconductor substrate 151A can be bonded to each other by using direct bonding utilizing intermolecular forces. However, the bonding method is not limited thereto, and various kinds of bonding methods such as plasma bonding of bonding both bonded surfaces after activating those surfaces by plasma processing may be used.

Figure 8:
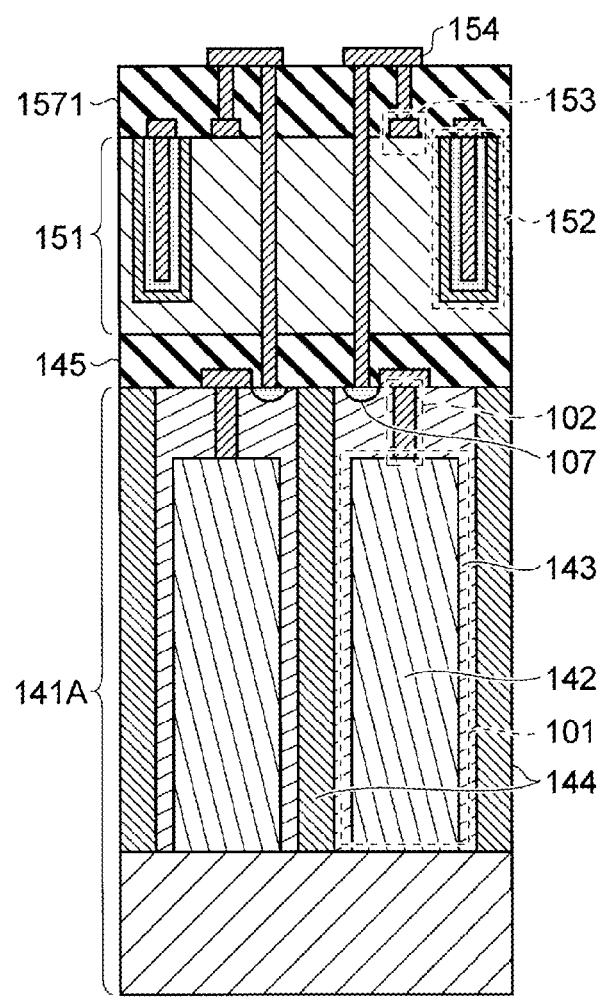
FIG. 8 is a process cross-sectional diagram for describing the method of producing the image sensor according to the first embodiment (part 2).

Next, as illustrated in FIG. 8, the semiconductor substrate 151A bonded to the insulation film 145 is thinned to have a predetermined thickness (e.g., 2~3 μm) by using a CMP method, for example.

Next, a trench for the trench capacitor 152 is formed by engraving the thinned semiconductor substrate 151 from the surface (upper surface) side thereof by photolithography and etching, for example.

Next, the lower electrode 1523 and the insulation film 1522 are formed sequentially in the trench formed on the semiconductor substrate 151 by using a sputtering method, for example. Then, the upper electrode 1521, which fills in the trench formed on the surface of the gate insulation film 1022, and the trench capacitor electrode 1524 on the upper side of the upper electrode 1521 are formed by using a sputtering method, for example. As a result, the trench capacitor 152 is formed on the semiconductor substrate 151.

The pixel transistor 153 including the reset transistor 103, the switch transistor 104, the amplification transistor 105, and the selection transistor 106 is formed on the upper surface side of the semiconductor substrate 151 in the same process as the process of forming the trench capacitor 152 described above.

After that, the first insulation film 1571 covering the upper surface of the semiconductor substrate 151 on which the trench capacitor 152 and the pixel transistor 153 are formed is formed.

Next, for example, a reactive ion etching (RIE) method is used to form a via that exposes the gate of each transistor in the pixel transistor 153 on the first insulation film 1571, and form a via that exposes the node 107 formed on the upper surface side of the semiconductor substrate 141A so as to extend from the first insulation film 1571 to the insulation film 145 via the semiconductor substrate 151.

Next, the in-hole insulation film 1551 is formed on at least an exposed surface of the semiconductor substrate 151 in the formed vias by annealing, for example. After that, the TSV 155 and the connected electrode 1552 filling in those vias are formed. Next, the wiring 154 electrically connecting the TSV 155 and the connected electrode 1552 to each other is formed on the first insulation film 1571 by using a lift-off technology or pattern etching, for example.

Figure 9:
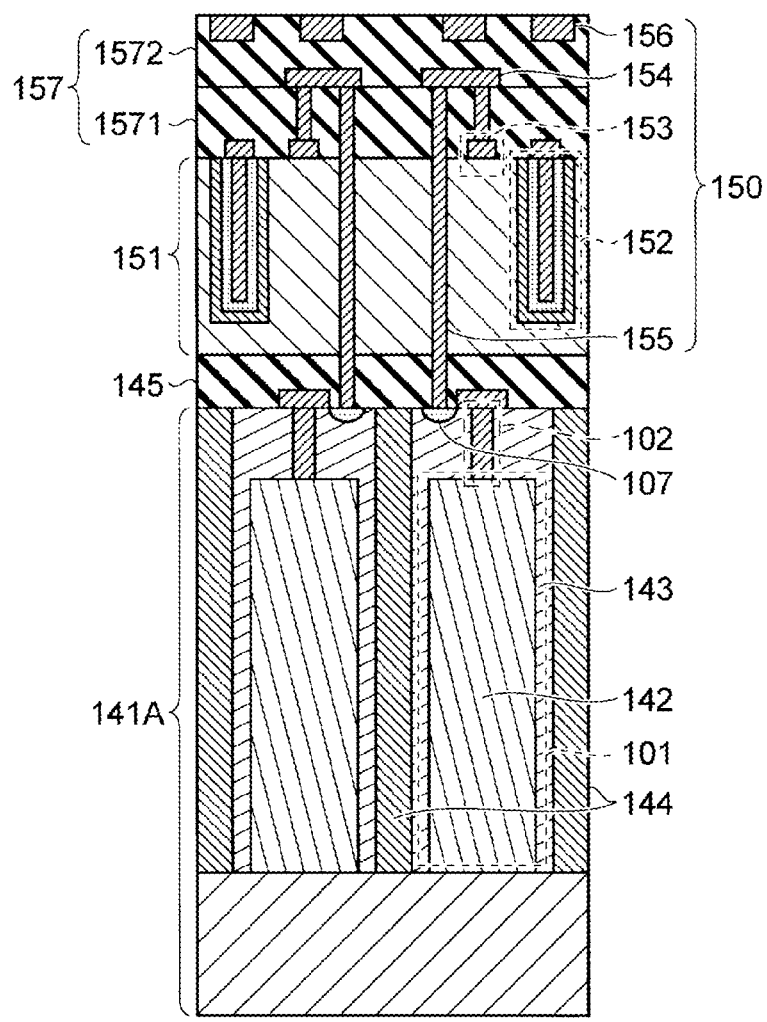
FIG. 9 is a process cross-sectional diagram for describing the method of producing the image sensor according to the first embodiment (part 3).

Next, as illustrated in FIG. 9, a second insulation film 1752 is formed on the first insulation film 1571 by using a sputtering method, for example. Then, a wiring (not shown) that electrically connects to each electrode formed on the first insulation film 1571 is formed in the second insulation film 1752, and after that, the copper (Cu) electrode pad 156 having an exposed upper surface, which electrically connects to the wiring in the second insulation film 1572, is formed on the second insulation film 1572. Methods such as a CVD method, an electroplating method, or a sputtering method can be used for forming the electrode pad 156.

Figure 10:
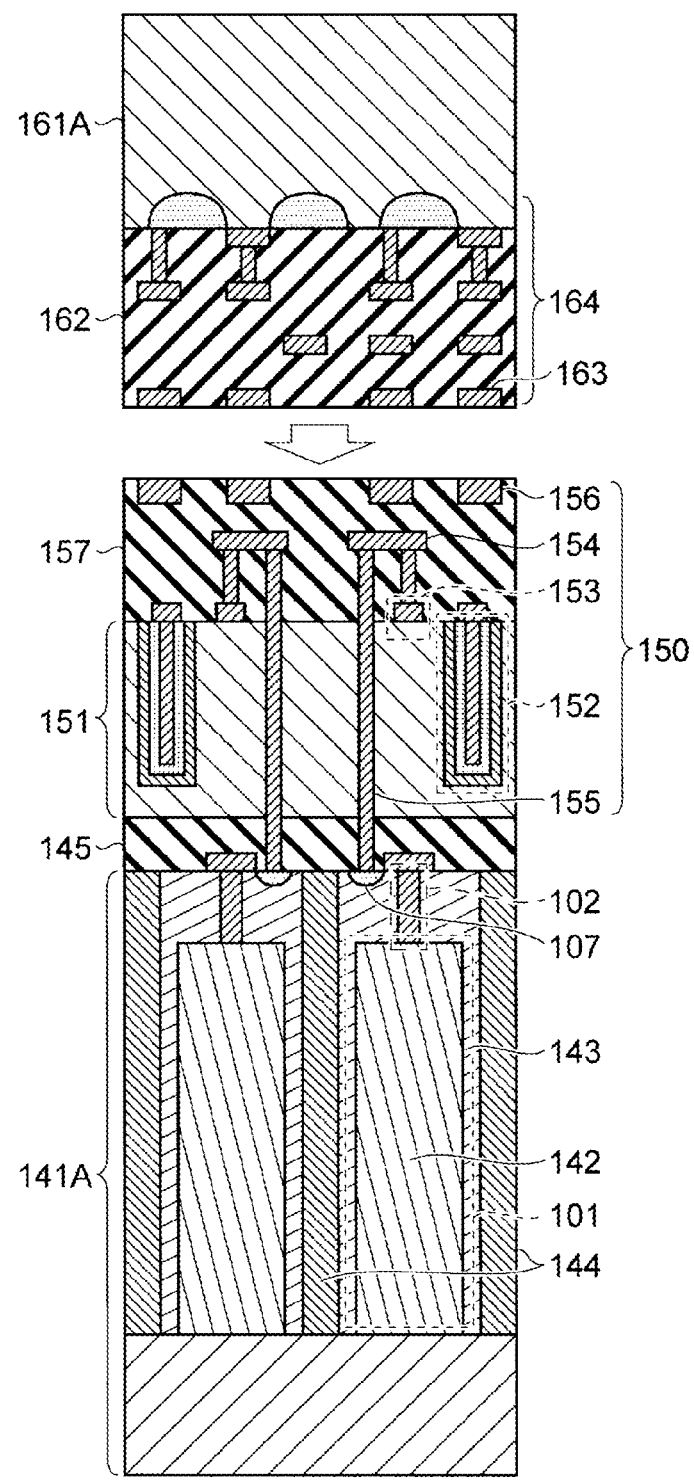
FIG. 10 is a process cross-sectional diagram for describing the method of producing the image sensor according to the first embodiment (part 4).

Next, as illustrated in FIG. 10, a semiconductor substrate 161A on which the circuit element 164 is formed is produced in a predetermined production process, and the copper (Cu) electrode pad 163 exposed on the surface (lower surface) of the insulation film 162 and the copper (Cu) electrode pad 156 exposed on the surface (upper surface) of the insulation film 157 on the semiconductor substrate 151 are bonded to each other (Cu—Cu bonding).

Next, the semiconductor substrate 161A on which the circuit element 164 is formed is thinned by using a CMP method, for example. Then, the laminate substrate produced by the process so far is inverted vertically, and the back surface of the semiconductor substrate 141A on which the photodiode 101 is formed is ground to reach the neighborhood of the photodiode 101 by using a CMP method, for example.

After that, appropriate processing such as removal of damage to the ground surface is executed, and then the color filter 122 and the on-chip lens 121 corresponding to each unit pixel 131 are formed on the semiconductor substrate 141 on which the photodiode 101 is formed. The light-shielding film 123 is formed as necessary. As a result, the image sensor 10 having the cross-sectional structure exemplified in FIG. 3 is produced.

1.8 Action and Effect

As described above, this embodiment has a configuration in which the trench capacitor 152 is formed on the second substrate 150 separate from the first substrate 140 on which the photodiode 101 is formed, and those substrates are bonded to each other. As a result, it is possible to achieve a wide dynamic range with single exposure by increasing the capacity per unit are while at the same time avoiding occurrence of problems such as deterioration in pixel integration, ion implantation to a deeper position, or read out of a signal from a deep position.

With the configuration described above, it is also possible to achieve, for example, suppression of a false signal of an animal moving within the angle of view, reduction of a pixel pitch, or suppression of a flicker of a light emitting diode (LED).

In the present embodiment, it is possible to switch whether to use the second floating diffusion (corresponding to capacitor 108 and trench capacitor 152) through control of the switch transistor 104, and thus it is also possible to switch between a high gain (when second floating diffusion is not used) and a wide dynamic range (when second floating diffusion is used) depending on the situation of night photography, for example.

The image sensor 10 according to this embodiment has laminate structure in which the first substrate 140 and the second substrate 150, on which the unit pixel 131 is formed, and the third substrate 160 on which the circuit element 164 including the signal processing circuit 15 is formed are bonded to each other. Therefore, it is possible to improve the degree of parallel signal processing of a high-resolution image. As a result, in addition to a wider dynamic range of each unit pixel 131, it is possible to achieve high-speed read out or higher resolution of an image, or modulate spatial sampling.

Reduction of a pixel pitch for determining the resolution is regulated by the widest one of the photodiode 101, the signal processing circuit 15, and a pixel circuit constructed by the reset transistor 103, the switch transistor 104, the amplification transistor 105, and the selection transistor 106. The signal processing circuit 15 can connect one AD conversion circuit 15a to a plurality of pixel circuits. In that case, in the present embodiment, reduction of the pixel pitch is regulated by the area of the photodiode 101 or the pixel circuit.

2. Second Embodiment

Next, a description is given in detail of a solid-state imaging device and an electronic device according to a second embodiment with reference to the drawings.

The configuration described in the first embodiment, in which the trench capacitor 152 is formed on the second substrate 150 separate from the first substrate 140 on which the photodiode 101 is formed, and those substrates are bonded to each other, is also effective for structure (hereinafter referred to as "shared pixel structure") in which the plurality of unit pixels 131 share the pixel transistor 153. In view of this, in the second embodiment, a description is given in detail of the case of adopting the shared pixel structure with reference to the drawings.

An image sensor according to this embodiment may have a configuration similar to that of the image sensor 10 exemplified in the first embodiment with reference to FIG. 1, for example. However, in the present embodiment, the unit pixel 131 in the pixel array unit 13 is replaced with a shared pixel 231 described later.

2.1 Example of Circuit Configuration of Shared Pixel

Figure 11:
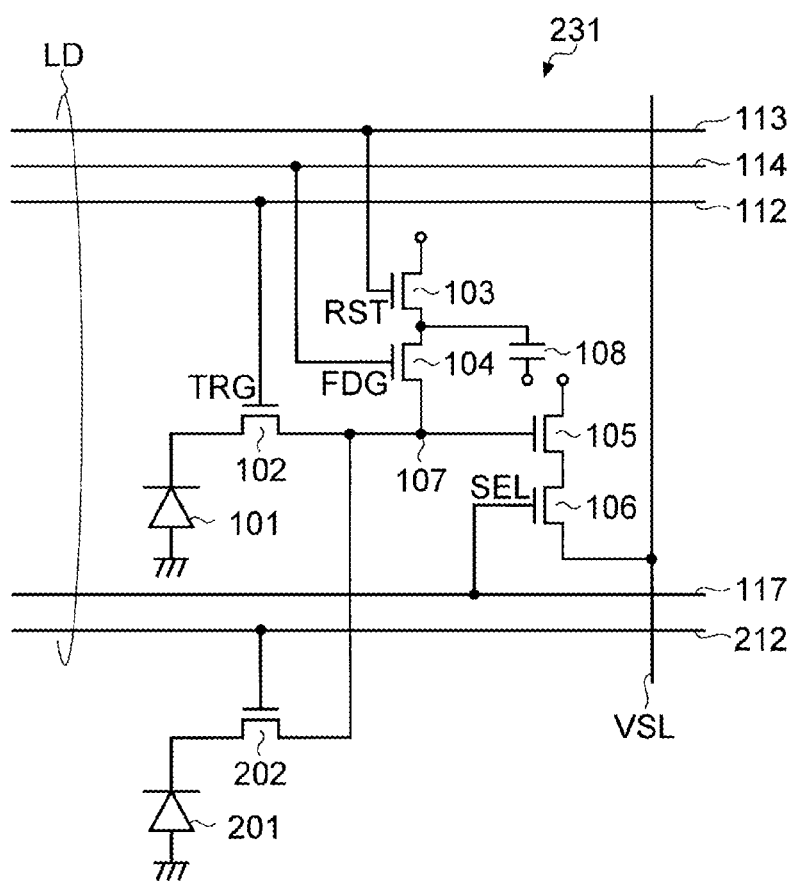
FIG. 11 is a circuit diagram illustrating an example of a schematic configuration of a shared pixel of an effective pixel region according to a second embodiment.

FIG. 11 is a circuit diagram illustrating an example of a schematic configuration of a shared pixel of an effective pixel region according to this embodiment. FIG. 11 exemplifies a case in which two photodiodes share the pixel transistor.

As illustrated in FIG. 11, the shared pixel 231 further includes a photodiode 201 and a transfer transistor 202 in addition to the configuration similar to that of the unit pixel 131 (refer to FIG. 2).

The anode of the photodiode 201 is connected to the ground, and the cathode of the photodiode 201 is connected to the source of the transfer transistor 202. The drain of the transfer transistor 202 is connected to the node 107 similarly to the transfer transistor 102. The gate of the transfer transistor 202 is connected to the transfer transistor drive line 112 serving as the pixel drive line LD having one end connected to the pixel drive circuit 12.

In such a configuration, when a charge that has occurred in the photodiode 101 is read, the transfer control signal TRG at a high level is input to the gate of the transfer transistor 102. Meanwhile, when a charge that has occurred in the photodiode 201 is read, the transfer control signal TRG at a high level is input to the gate of the transfer transistor 202.

In both cases of reading charges from the photodiode 101 and the photodiode 201, the read charges are accumulated in the node 107. As a result, the voltage of a voltage value that depends on the quantity of the accumulated charge is applied to the gate of the amplification transistor 105.

The other configurations and operations may be similar to those described in the first embodiment with reference to FIG. 2, and thus a detailed description thereof is omitted.

2.2 Example of Schematic Configuration of Shared Pixel

Figure 12:
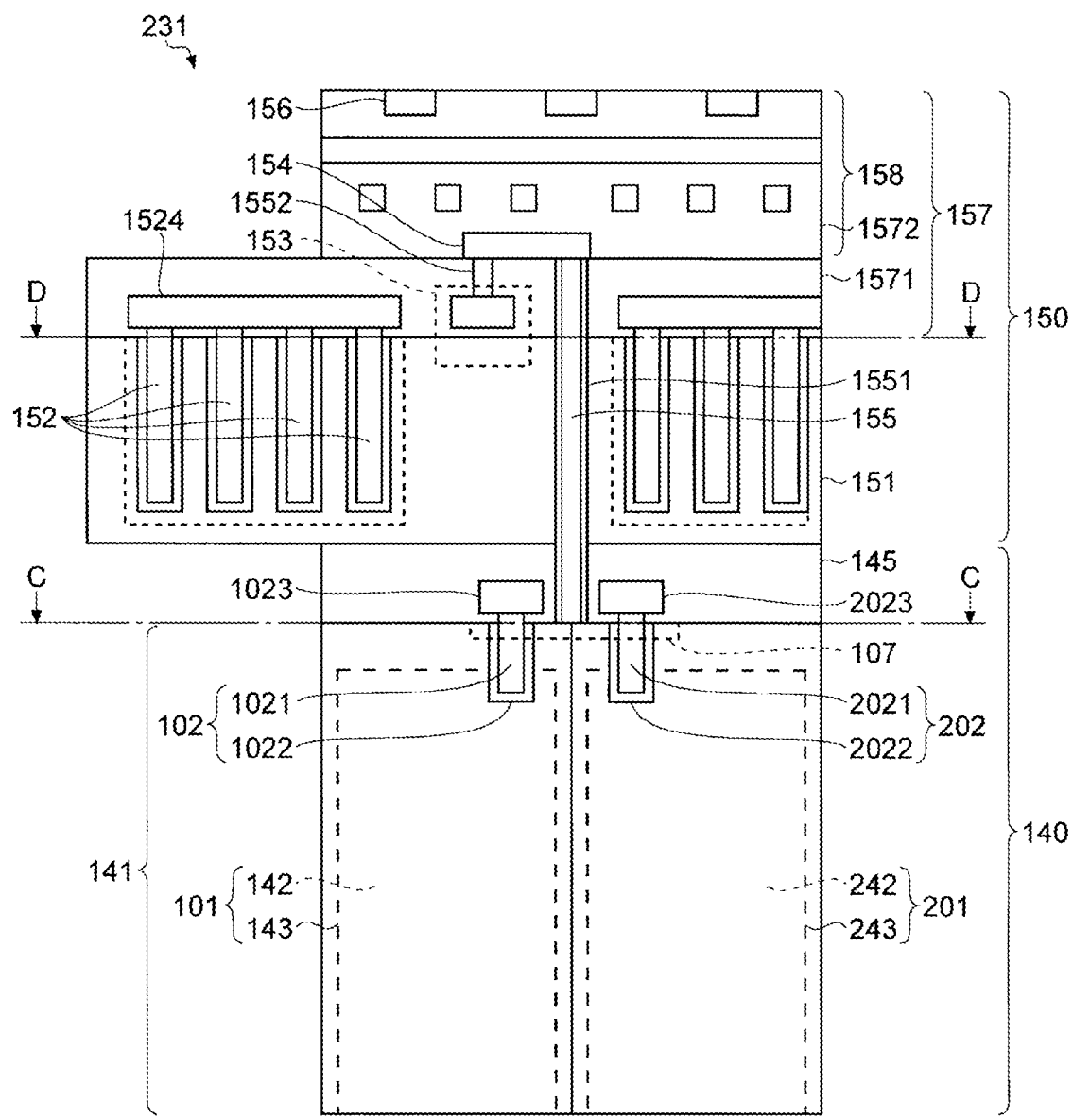
FIG. 12 is a cross-sectional diagram illustrating an example of cross-sectional structure of the shared pixel according to the second embodiment.

Next, a description is given of cross-sectional structure of the shared pixel 231. FIG. 12 is a cross-sectional diagram illustrating an example of cross-sectional structure of the shared pixel according to this embodiment. In FIG. 12, light enters the photodiode 101 from the lower side of FIG. 12. In FIG. 12, hatching of each unit is omitted in consideration of visibility. In FIG. 12, it is assumed that four trench capacitors 152 are provided for one shared pixel 231.

As illustrated in FIG. 12, the shared pixel 231 has structure in which the second photodiode 201 and the transfer transistor 202 are added in addition to the configuration similar to that of the unit pixel 131 exemplified in FIG. 4. Similarly to the photodiode 101 and the transfer transistor 102, the photodiode 201 and the transfer transistor 202 are provided on the first substrate 140.

Similarly to the photodiode 101, for example, an n-type semiconductor region 242 of the photodiode 201 is formed as a charge accumulation region that accumulates a charge (electron). The n-type semiconductor region 242 of the photodiode 201 is provided inside a p-type semiconductor region 243 of the semiconductor substrate 141.

The impurity concentration of a region within the p-type semiconductor region 243, which is on the side of the surface (upper surface) of the semiconductor substrate 141, may be set to be higher than the impurity concentration of a region within the p-type semiconductor region 243, which is on the side of the back surface (lower surface) of the semiconductor substrate 141, for example. In other words, similarly to the photodiode 101, the photodiode 201 may have hole-accumulation-diode (HAD) structure. With such a configuration, it is possible to suppress occurrence of a dark current in each boundary between the upper surface side and the lower surface side of the n-type semiconductor region 142.

The transfer transistor 202 includes a transfer gate 2021 and a gate insulation film 2022, and the transfer transistor 202 transfers the charge that has occurred in the photodiode 201 to the node 107 being the first floating diffusion. A transfer transistor electrode 2023 to which the transfer control signal TRG is input is connected to the transfer gate 2021.

The other configurations may be similar to those described in the first embodiment with reference to FIG. 3 and FIG. 4, and thus a detailed description thereof is omitted.

2.2.1 Example of Layout of Shared Pixel

Now, a description is given in detail of the layout of each of a C-C cross-section and a D-D cross-section in FIG. 12 with reference to FIG. 12. The C-C cross-section corresponds to a boundary surface between the semiconductor substrate 141 and the insulation film 145 in the first substrate 140. The D-D cross-section corresponds to a boundary surface between the semiconductor substrate 151 and the first insulation film 1571 in the second substrate 150.

2.2.1.1 Example of Layout of C-C Cross-Section

Figure 13:
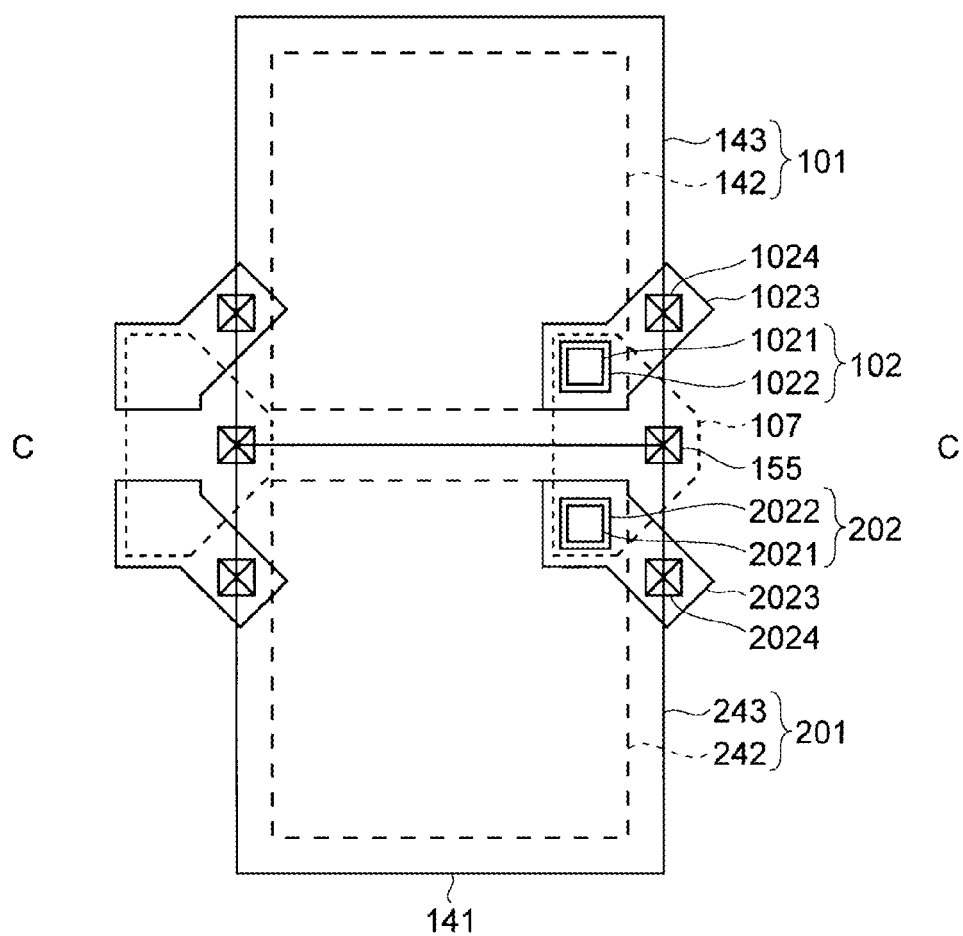
FIG. 13 is a diagram illustrating an example of a layout of a C-C cross-section in FIG. 12.

FIG. 13 is a diagram illustrating an example of the layout of the C-C cross-section in FIG. 12. In FIG. 13, for the sake of convenience of description, a configuration that does not appear in the C-C cross-section is also illustrated.

As illustrated in FIG. 13, the photodiode 101 includes the n-type semiconductor region 142, which is formed substantially at the center of a square region assigned to one photodiode in the semiconductor substrate 141, and the p-type semiconductor region 143 surrounding the n-type semiconductor region 142, for example. The transfer gate 1021 covered by the gate insulation film 1022 (refer to FIG. 12) is embedded into the n-type semiconductor region 142.

The transfer transistor electrode 1023 on the upper side of the transfer gate 1021 is connected to the transfer transistor drive line 112 (refer to FIG. 11) via a wiring including the electrode 1024, which is not shown in FIG. 12.

Meanwhile, the photodiode 201 and the transfer transistor 202 are provided on a region adjacent to the photodiode 101 in a column direction and closer to the transfer transistor 102 such that the layout of the photodiode 201 and the transfer transistor 202 is linearly symmetrical with that of the photodiode 201 and the transfer transistor 202.

Specifically, the photodiode 201 includes the n-type semiconductor region 242, which is formed substantially at the center of a square region assigned to one photodiode in the semiconductor substrate 141, and the p-type semiconductor region 243 surrounding the n-type semiconductor region 242, for example. The transfer gate 2021 covered by the gate insulation film 2022 (refer to FIG. 12) is embedded into the n-type semiconductor region 242.

The transfer transistor electrode 2023 on the upper side of the transfer gate 2021 is connected to the transfer transistor drive line 212 (refer to FIG. 11) via a wiring including an electrode 2024, which is not shown in FIG. 12.

The transfer gate 1021 and the transfer gate 2021 are connected to the TSV 155 via the node 107. The TSV 155 is arranged at one end of a boundary portion of regions in which the two photodiodes 101 and 201 forming the shared pixel 231 are provided, for example.

2.2.1.2 Example of Layout of D-D Cross-Section

Figure 14:
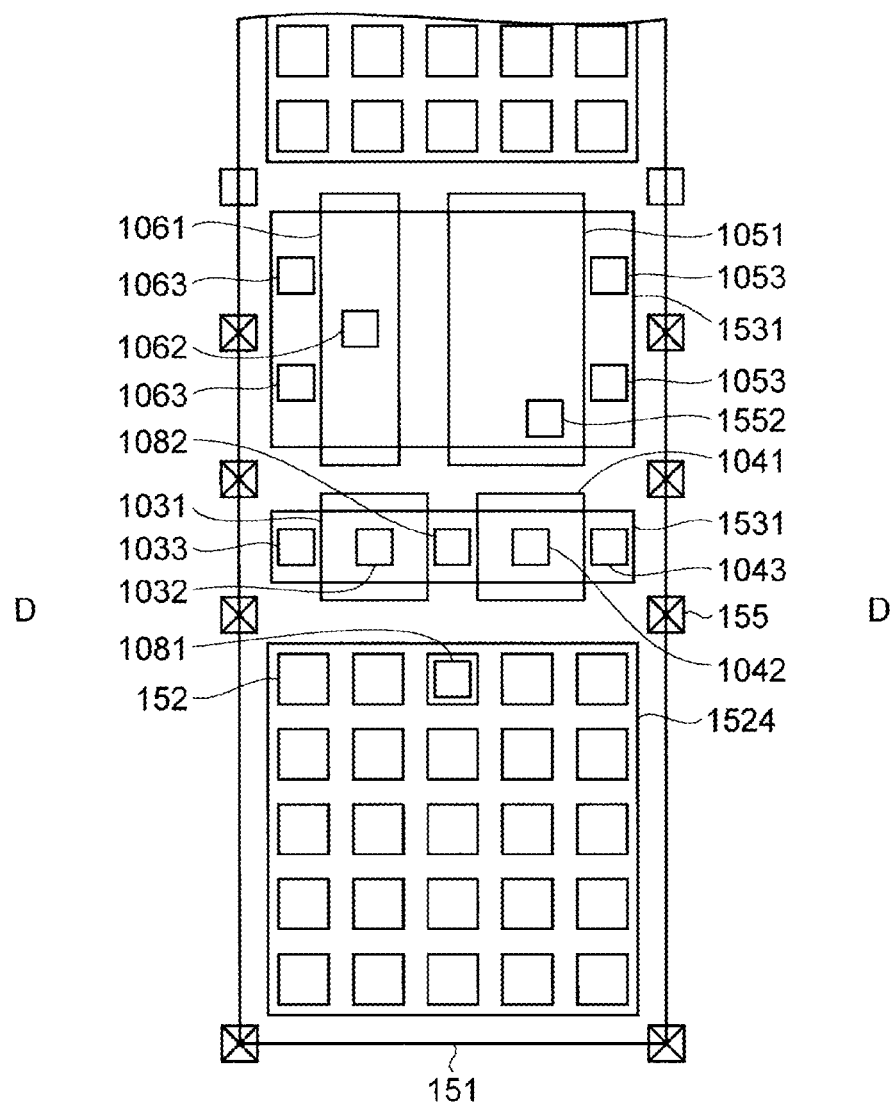
FIG. 14 is a diagram illustrating an example of a layout of a D-D cross-section in FIG. 12.

FIG. 14 is a diagram illustrating an example of the layout of the D-D cross-section in FIG. 12. In FIG. 14, for the sake of convenience of description, a configuration that does not appear in the D-D cross-section is also illustrated.

As illustrated in FIG. 14, in the shared pixel 231, the components described in the first embodiment with reference to FIG. 6 are arranged on a region corresponding to the two unit pixels 131. In the example illustrated in FIG. 14, the pixel transistor 153 and a wiring and electrode connected thereto are arranged in a region (e.g., region corresponding to photodiode 101 of first substrate 140) corresponding to one unit pixel 131, and the plurality of trench capacitors 152 are arranged in a region (e.g., region corresponding to photodiode 201 of first substrate 140) corresponding to the other unit pixel 131.

2.3 Action and Effect

As described above, this embodiment has a configuration in which two or more photodiodes share the pixel transistor 153. As a result, it is possible to secure a wide region for arranging the trench capacitor 152. For example, in the example illustrated in FIG. 6, there are four trench capacitors 152, whereas in the example illustrated in FIG. 14, a region for arranging 25 trench capacitors 152 is secured.

In this manner, a wide region for arranging the trench capacitor 152 can be secured to increase the capacity per unit area. Therefore, it is possible to achieve a wider dynamic range with single exposure.

As can be understood from comparison between FIG. 14 and FIG. 6, it is also possible to increase the area of the amplification gate 1051. Therefore, it is also possible to decrease a random noise.

The other configurations, operations, and effects may be similar to those described in the above-mentioned embodiments, and thus a detailed description thereof is omitted.

3. Third Embodiment

Next, a description is given in detail of a solid-state imaging device and an electronic device according to a third embodiment with reference to the drawings. In the third embodiment, a description is given of an image sensor having laminate structure different from those of the first and second embodiments by way of example.

3.1 Example of Cross-Sectional Structure of Image Sensor

Figure 15:
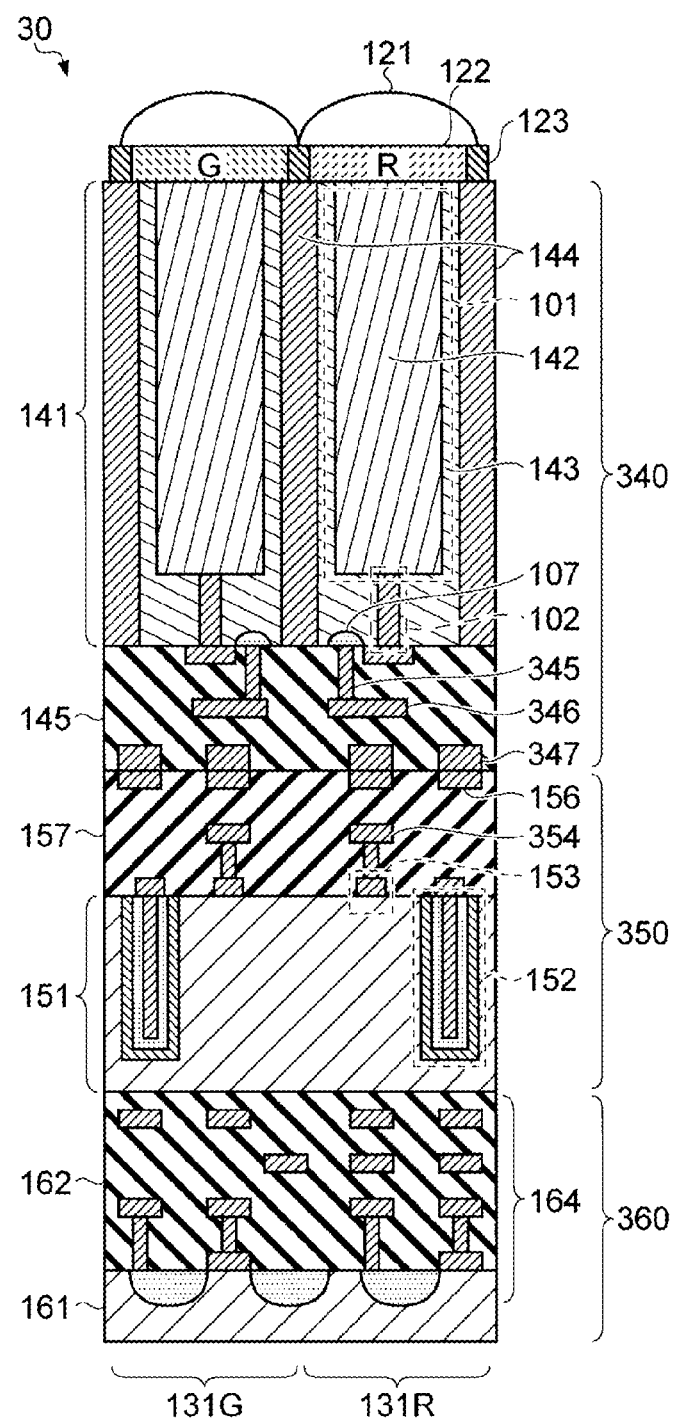
FIG. 15 is a cross-sectional diagram illustrating an example of cross-sectional structure of an image sensor according to a third embodiment.

FIG. 15 is a cross-sectional diagram illustrating an example of cross-sectional structure of the image sensor according to this embodiment. In FIG. 15, the side of incidence of light is set as an upper side, and cross-sectional structure of a surface parallel to the direction of incidence of light is illustrated. In FIG. 15, the unit pixels 131G and 131R, which receive light of green G and red R among three primary colors of RGB, are illustrated. However, the configuration is not limited thereto. In the following description, the unit pixel 131 for each color is not distinguished and is assigned with a reference numeral 131 for the sake of simplicity of description. In the configuration illustrated in FIG. 15, the same configuration as the configuration described in the above-mentioned first embodiment with reference to FIG. 3 is assigned with the same reference numeral, and a redundant description thereof is omitted.

As illustrated in FIG. 15, an image sensor 30 has laminate structure in which a first substrate 340, a second substrate 350, and a third substrate 360 are bonded to one another. In this laminate structure, the unit pixel 131 is formed across the first substrate 140 and the second substrate 150, for example.

In the image sensor 10 according to the first embodiment, the first substrate 140 and the second substrate 150 are bonded to each other by direct bonding, and the second substrate 150 and the third substrate 160 are bonded to each other by Cu—Cu bonding. However, in the image sensor 30 according to this embodiment, the first substrate 340 and the second substrate 350 are bonded to each other by Cu—Cu bonding, and the second substrate 350 and the third substrate 360 are bonded to each other by direct bonding.

In view of this, in the present embodiment, a copper (Cu) electrode pad 347, which functions as a connection point (Cu—Cu bonding) that mechanically bonds the first substrate 340 and the second substrate 350 to each other while at the same time electrically connecting the first substrate 340 and the second substrate 350 to each other, is formed on the surface (lower surface) of the insulation film 145 formed on the back surface (lower surface) of the semiconductor substrate 141 on the first substrate 340. The electrode pad 347 is electrically connected to the node 107 via an electrode 345 and a wiring 346 formed inside the insulation film 145, for example, Meanwhile, regarding the second substrate 350, not the back surface of the semiconductor substrate 151 but the surface (upper surface) of the insulation film 157 on the surface (upper surface) of the semiconductor substrate 151 is bonded to the first substrate 340. In this manner, the copper (Cu) electrode pad 347 of the first substrate 340 and the copper (Cu) electrode pad 156 of the second substrate 350 are connected to each other electrically and mechanically, with the result that the first substrate 340 and the second substrate 350 are bonded to each other. The electrode pad 156 formed on the surface (upper surface) of the insulation film 157 is electrically connected to the pixel transistor 153 via a wiring 354 formed inside the insulation film 157, for example.

The surface (upper surface) of the insulation film 162 of the third substrate 360 is bonded to a surface of the second substrate 350, which is opposite to the surface bonded to the first substrate 340, namely, the back surface (lower surface) of the semiconductor substrate 151. The electrode pad 163 is not formed on the surface of the insulation film 162. Instead, in the present embodiment, the surface of the insulation film 162 is flattened by using a CMP method, for example. Thus, the flattened surface of the insulation film 162 is pressed against the similarly flattened back surface of the semiconductor substrate 151, and is subjected to predetermined processing, such that both the surfaces are bonded to each other by direct bonding.

3.2 Example of Manufacturing Process

Next, a description is given in detail of a method of producing the image sensor 30 according to this embodiment with referenced to the drawings. FIG. 16 to FIG. 20 are process cross-sectional diagrams for describing the method of producing the image sensor according to this embodiment. In the following description, processes similar to those described in the first embodiment with reference to FIG. 7 to FIG. 10 are incorporated, and a detailed description thereof is omitted.

Figure 16:
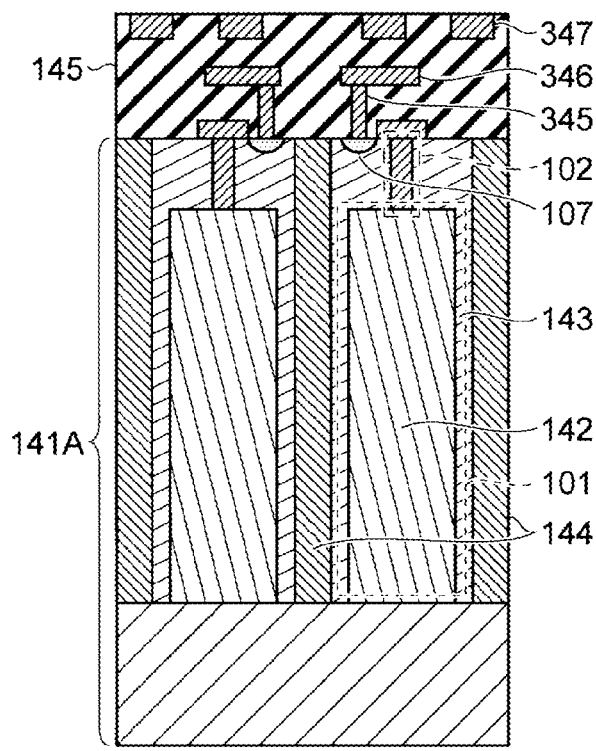
FIG. 16 is a process cross-sectional diagram for describing a method of producing the image sensor according to the third embodiment (part 1).

In this production method, as illustrated in FIG. 16, first, the photodiode 101 including the p-type semiconductor region 143 and the n-type semiconductor region 142, the pixel separation unit 144, the transfer transistor 102, the node 107, and an electrode such as the transfer transistor electrode 1023 and a wiring are formed on the semiconductor substrate 141A before thinning. After that, the insulation film 145 covering the upper surface of the semiconductor substrate 141 is formed. The processes described so far may be similar to those described in the first embodiment with reference to FIG. 7. The electrode 345, the wiring 346, and the like for electrically connecting components including the node 107 to the electrode pad 347 to one another are formed in the insulation film 145. The upper surface of the insulation film 145 may be flattened by a CMP method, for example.

Next, in the present embodiment, the copper (Cu) electrode pad 347 for Cu—Cu bonding is formed on the upper surface of the insulation film 145. The electrode pad 347 can be formed by using a CVD method, an electroplating method, or a sputtering method, for example.

Figure 17:
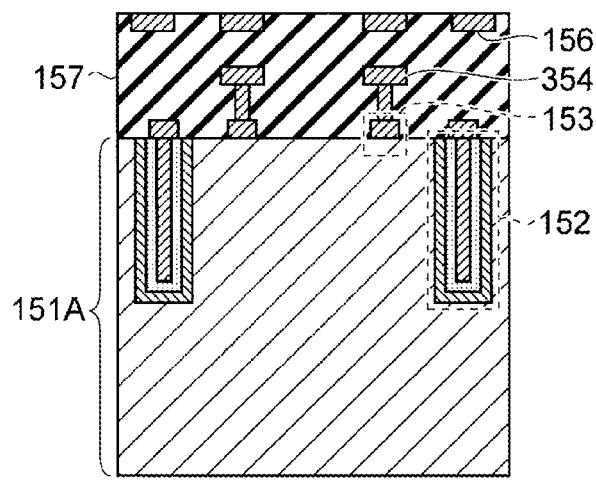
FIG. 17 is a process cross-sectional diagram for describing the method of producing the image sensor according to the third embodiment (part 2).

In the present embodiment, as illustrated in FIG. 17, the second substrate 350 on which the trench capacitor 152 is formed is produced separately from the first substrate 340. Specifically, a trench for the trench capacitor 152 is formed by engraving the semiconductor substrate 151A before thinning from the surface (upper surface) side thereof by photolithography and etching, for example. The lower electrode 1523, the gate insulation film 1022, the upper electrode 1521, and the trench capacitor electrode 1524 on the upper side of the upper electrode 1521 are formed in the trench. The pixel transistor 153 including the reset transistor 103, the switch transistor 104, the amplification transistor 105, and the selection transistor 106 is formed on the upper surface side of the semiconductor substrate 151 in the same process as the process of forming the trench capacitor 152 described above. Those processes may be similar to those described in the first embodiment with reference to FIG. 8.

After that, the insulation film 157 covering the upper surface of the semiconductor substrate 151 on which the trench capacitor 152 and the pixel transistor 153 are formed is formed. A wiring 355 or the like electrically connected to the pixel transistor 153 is formed in the insulation film 157. The upper surface of the insulation film 157 may be flattened by a CMP method, for example.

Next, the copper (Cu) electrode pad 156 for Cu—Cu bonding is formed on the upper surface of the insulation film 157. The electrode pad 156 can be formed by using a CVD method, an electroplating method, or a sputtering method, for example.

Figure 18:
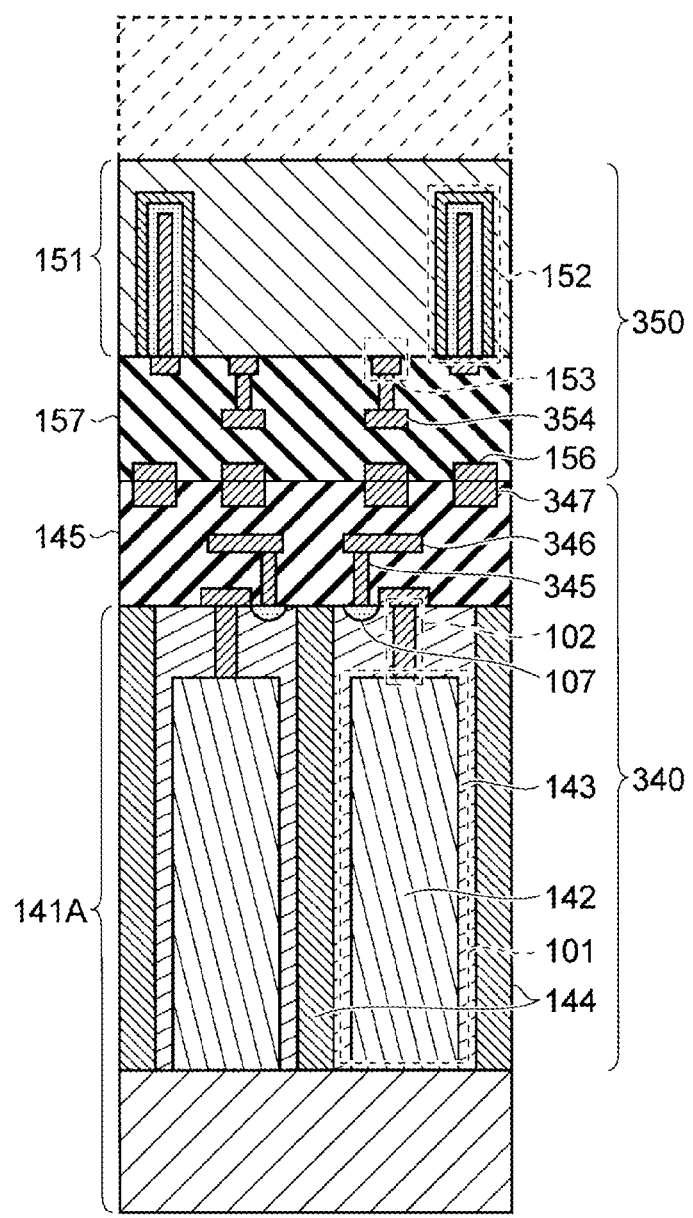
FIG. 18 is a process cross-sectional diagram for describing the method of producing the image sensor according to the third embodiment (part 3).

Next, as illustrated in FIG. 18, the copper (Cu) electrode pad 347 formed on the insulation film 145 of the semiconductor substrate 141A and the copper (Cu) electrode pad 156 formed on the insulation film 157 of the semiconductor substrate 151A are bonded to each other (Cu—Cu bonding). After that, the semiconductor substrate 151A on which the trench capacitor 152 is formed is thinned by using a CMP method, for example. The semiconductor substrate 151A may be thinned as long as the electric characteristics of the trench capacitor 152 and the pixel transistor 153 are not impaired, for example. The thickness of the thinned semiconductor substrate 151A may be 1.5 to 3 μm, for example.

Figure 19:
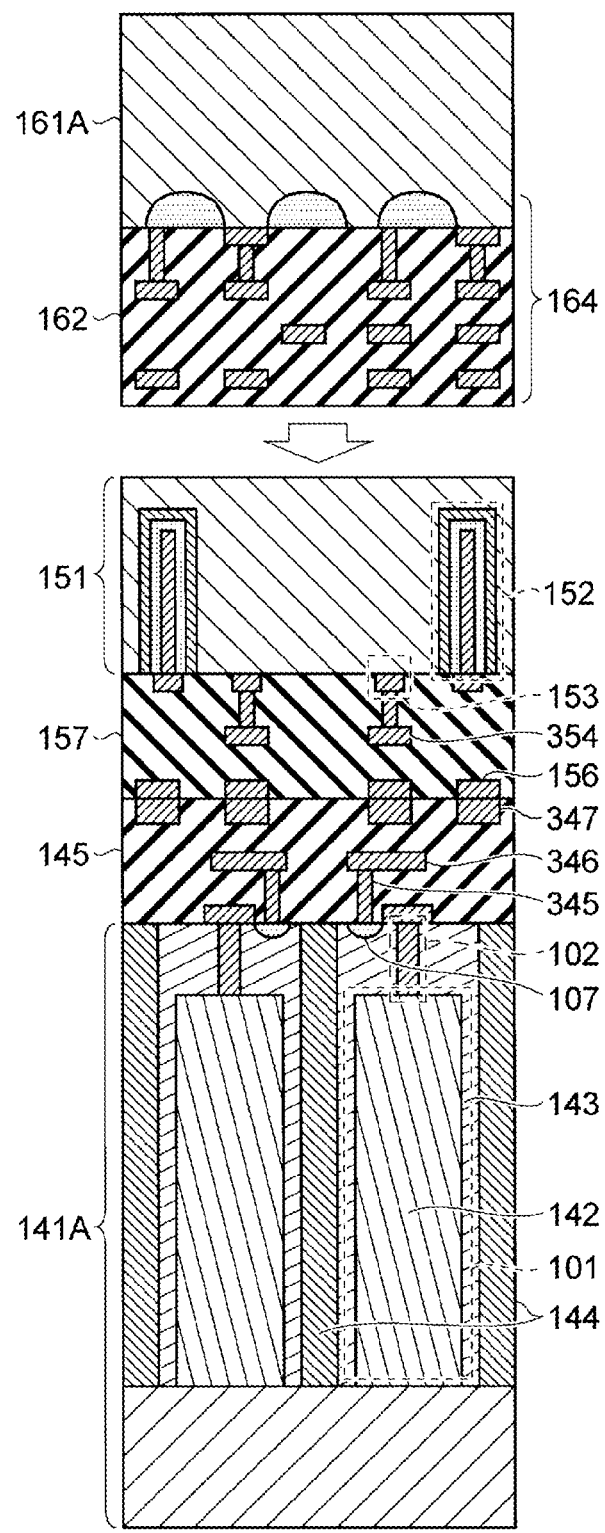
FIG. 19 is a process cross-sectional diagram for describing the method of producing the image sensor according to the third embodiment (part 4).

Next, as illustrated in FIG. 19, the semiconductor substrate 161A on which the circuit element 164 is formed is produced in a predetermined production process. The surface (lower surface) of the insulation film 162 serving as a bonded surface is flattened by using a CMP method, for example. Then, the flattened surface (lower surface) of the insulation film 162 and the back surface of the semiconductor substrate 151 are bonded to each other by direct bonding utilizing intermolecular forces. The back surface of the semiconductor substrate 151 serving as a bonded surface is flattened by using a CMP method, for example.

Figure 20:
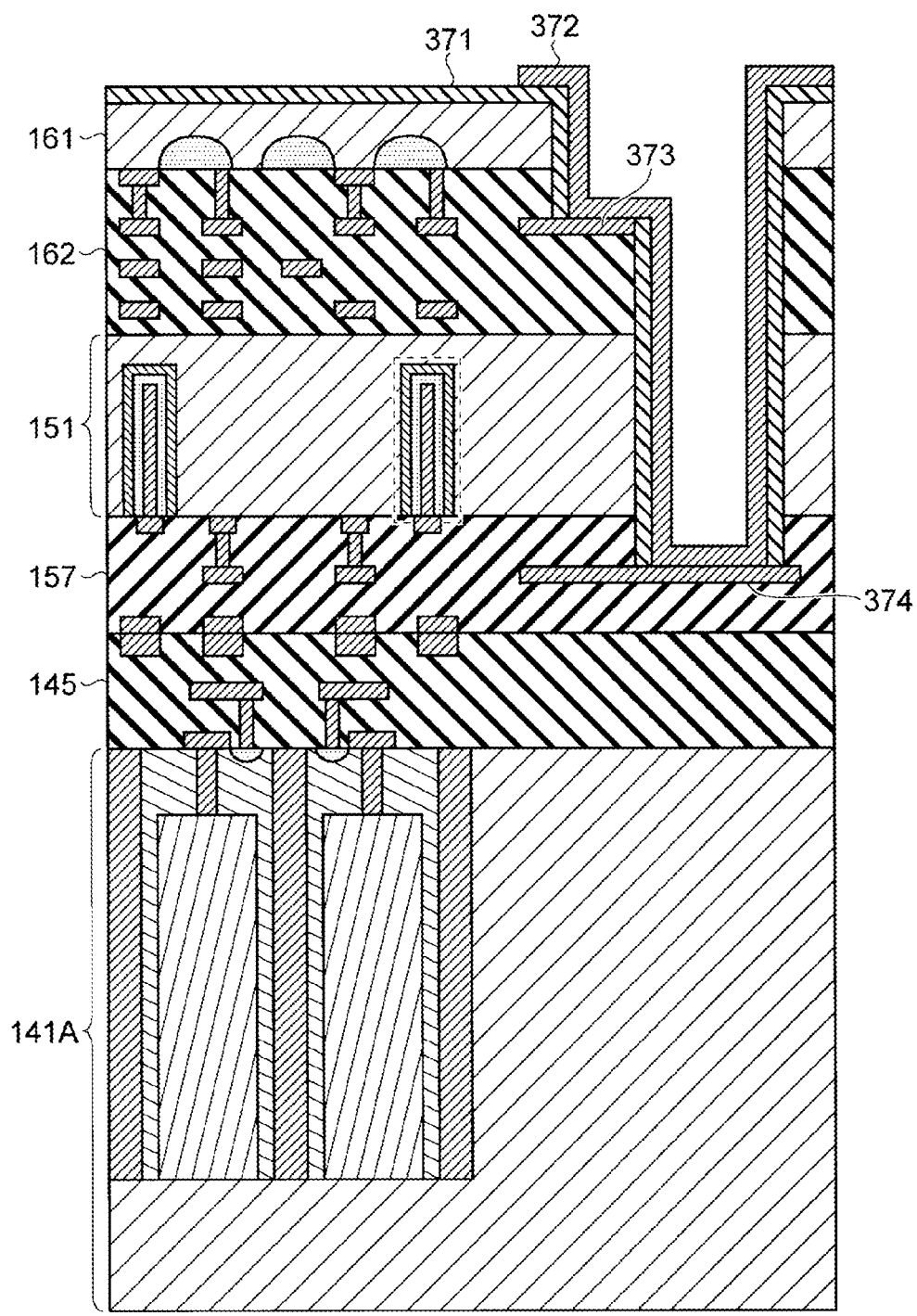
FIG. 20 is a process cross-sectional diagram for describing the method of producing the image sensor according to the third embodiment (part 5).

Next, as illustrated in FIG. 20, the semiconductor substrate 161A on which the circuit element 164 is formed is thinned by using a CMP method, for example. Then, a via that reaches a wiring layer 374 in the insulation film 157 via the semiconductor substrate 161, the insulation film 162, and the semiconductor substrate 151 is formed. In addition to a part of the wiring layer 374 in the insulation film 157, a part of a wiring layer 373 in the insulation film 162 is also exposed in this via.

Next, an insulation film 371 covering the inner side surfaces of the semiconductor substrates 161 and 151, which are exposed at least in the via, is formed, and after that, a via wiring 372 for electrically connecting the wiring layer 374 exposed in the insulation film 157 and the wiring layer 373 exposed in the insulation film 162 to each other is formed in the via. For example, a metal such as a copper (Cu) or other conductors can be used as the material of the via wiring 372. For example, methods such as a CVD method and a sputtering method can be adopted to form the via wiring 372.

Next, the laminate substrate produced by the process so far is inverted vertically, and the back surface of the semiconductor substrate 141A on which the photodiode 101 is formed is ground to reach the neighborhood of the photodiode 101 by using a CMP method, for example.

After that, appropriate processing such as removal of damage to the ground surface is executed, and then the color filter 122 and the on-chip lens 121 corresponding to each unit pixel 131 are formed on the semiconductor substrate 141 on which the photodiode 101 is formed. The light-shielding film 123 is formed as necessary. As a result, the image sensor 30 having the cross-sectional structure exemplified in FIG. 15 is produced.

3.3 Action and Effect

As described above, the first substrate 340 and the second substrate 350 can also be bonded to each other by Cu—Cu bonding, and the second substrate 350 and the third substrate 360 can also be bonded to each other by direct bonding.

The other configurations, operations, and effects may be similar to those described in the above-mentioned embodiments, and thus a detailed description thereof is omitted.

In the above, embodiments of this disclosure have been described. The technical scope of this disclosure is not limited to the above-mentioned embodiments itself, and various modifications can be made within a range that does not depart from the gist of this disclosure. Components in different embodiments and modification examples may be appropriately combined.

The effect obtained in each embodiment described in this specification is only an example, and is not limited thereto. Other effects may be obtained.

This technology may also adopt the following configuration.

(1)

A solid-state imaging device, comprising:
a first substrate including a photoelectric conversion element; and
a second substrate including a capacitor positioned on a side opposite to a surface of incidence of light to the photoelectric conversion element in the first substrate, and configured to accumulate a charge transferred from the photoelectric conversion element.

(2)

The solid-state imaging device according to (1), wherein the capacitor is a trench capacitor.

(3)

The solid-state imaging device according to (1) or (2), wherein:
the first substrate includes a plurality of the photoelectric conversion elements; and
the capacitor is configured to accumulate a charge transferred from at least one of the photoelectric conversion elements.

(4)

The solid-state imaging device according to any one of (1) to (3), wherein the capacitor includes a plurality of trench capacitors.

(5)

The solid-state imaging device according to (4), wherein the trench capacitors are connected to one another in parallel.

(6)

The solid-state imaging device according to any one of (1) to (5), wherein the first substrate and the second substrate are bonded to each other by direct bonding.

(7)

The solid-state imaging device according to any one of (1) to (5), wherein:
the first substrate further includes a first copper electrode pad provided on a surface opposite to the surface of incidence;
the second substrate further includes a second copper electrode pad provided on a surface opposed to the first substrate; and
the first substrate and the second substrate are bonded to each other through bonding between the first copper electrode pad and the second copper electrode pad.

(8)

The solid-state imaging device according to any one of (1) to (7), wherein the first substrate further includes a transfer transistor configured to control transfer of a charge from the photoelectric conversion element to the capacitor.

(9)

The solid-state imaging device according to any one of (1) to (8), wherein the second substrate further includes a pixel circuit including:
a reset transistor configured to control discharge of the charge accumulated in the capacitor;
an amplification transistor configured to cause, in a drain, a pixel signal of a voltage value that depends on a quantity of the charge accumulated in the capacitor; and
a selection transistor configured to switch connection between the drain of the amplification transistor and a predetermined wiring.

(10)

The solid-state imaging device according to (9), wherein the capacitor is connected between a gate of the amplification transistor and a ground.

(11)

The solid-state imaging device according to (9), further comprising a switch transistor with a source connected to a gate of the amplification transistor and a drain connected to a source of the reset transistor,
wherein the capacitor is connected between a ground and a node that connects the source of the reset transistor and the drain of the switch transistor to each other.

(12)

The solid-state imaging device according to any one of (9) to (11), further comprising a third substrate positioned on a side opposite to a surface of the second substrate opposed to the first substrate,
wherein the third substrate includes a circuit element configured to execute predetermined processing for the pixel signal that has appeared in the predetermined wiring.

(13)

The solid-state imaging device according to (12), wherein the circuit element includes a conversion circuit configured to convert the pixel signal that has appeared in the predetermined wiring into a digital value.

(14)

The solid-state imaging device according to (13), wherein the circuit element further includes a logic circuit configured to execute correlated double sampling processing for the pixel signal converted into the digital value by the conversion circuit.

(15)

The solid-state imaging device according to any one of (12) to (14), wherein the second substrate and the third substrate are bonded to each other by direct bonding.

(16)

The solid-state imaging device according to any one of (12) to (15), wherein:
the second substrate further includes a third copper electrode pad provided on a surface opposed to the third substrate;
the third substrate further includes a fourth copper electrode pad provided on a surface opposed to the second substrate; and the second substrate and the third substrate are bonded to each other by bonding between the third copper electrode pad and the fourth copper electrode pad.

(17) The solid-state imaging device according to any one of (12) to (16), wherein:
the second substrate includes a plurality of the pixel circuits;
the predetermined wiring includes a plurality of vertical signal lines provided for the pixel circuits on a one-to-one basis; and
the third substrate includes a plurality of the circuit elements provided for the vertical signal lines on a one-to-one basis.

(18) The solid-state imaging device according to any one of (12) to (16), wherein:
the second substrate includes a plurality of the pixel circuits; and
the drain of the amplification transistor of each of the pixel circuits is connected to the common predetermined wiring via the selection transistor.

(19) The solid-state imaging device according to (18), wherein a plurality of the pixel circuits are arranged in a matrix form; and
the drain of the amplification transistor of each of the pixel circuits arranged in the same line among the pixel circuits arranged in the matrix form is connected to the common predetermined wiring via the selection transistor.

(20) An electronic device, comprising:
a first substrate including a photoelectric conversion element; and
a second substrate including a capacitor positioned on a side opposite to a surface of incidence of light to the photoelectric conversion element in the first substrate, and configured to accumulate a charge transferred from the photoelectric conversion element.

REFERENCE SIGNS LIST 10, 30 image sensor
11 timing control circuit
12 pixel drive circuit
13 pixel array unit
15 signal processing circuit
15a AD conversion circuit
17 reference voltage generator
18 horizontal transfer circuit
19 output circuit
101, 201 photodiode
102, 202 transfer transistor
103 reset transistor
104 switch transistor
105 amplification transistor
106 selection transistor
107 node
108 capacitor
112, 212 transfer transistor drive line
113 reset transistor drive line
114 switch transistor drive line
117 selection transistor drive line
121 on-chip lens
122 color filter
123 light-shielding film
131, 131G, 131R unit pixel
140, 340 first substrate
141, 151, 161 semiconductor substrate
142, 242 n-type semiconductor region
143, 243 p-type semiconductor region
144 pixel separation unit
145, 157, 162, 371 insulation film
150, 350 second substrate
152 trench capacitor
153 pixel transistor
154, 346 wiring
155 TSV
156, 163, 347 electrode pad
160, 360 third substrate
164 circuit element
231 shared pixel
372 via wiring
373, 374 wiring layer
1021, 2021 transfer gate
1022, 2022 gate insulation film
1023, 2023 transfer transistor electrode
1024, 1032, 1033, 1042, 1043, 1053, 1062, 1063, 1081, 1082, 2024, 345 electrode
1031 reset gate
1041 switch gate
1051 amplification gate
1061 selection gate
1521 upper electrode
1522 insulation film
1523 lower electrode
1524 trench capacitor electrode
1531, 1532 activation region
1551 in-hole insulation film
1552 connected electrode
1571 first insulation film
1572 second insulation film
FDG switch signal
LD pixel drive line
HSL horizontal signal line
RST reset signal
SEL selection control signal
TRG transfer control signal
VSL vertical signal line

What is claimed is:

1. An electronic device, comprising:
a first substrate including a photoelectric conversion element; and
a second substrate including a capacitor positioned on a side opposite to a surface of incidence of light to the photoelectric conversion element in the first substrate, and configured to accumulate a charge transferred from the photoelectric conversion element,
wherein the first substrate further includes a first copper electrode pad provided on a surface opposite to the surface of incidence,
wherein the second substrate further includes a second copper electrode pad provided on a surface opposed to the first substrate, and
wherein the first substrate and the second substrate are bonded to each other through bonding between the first copper electrode pad and the second copper electrode pad.

2. The electronic device according to claim 1, wherein the capacitor is a trench capacitor.

3. The electronic device according to claim 1, wherein:
the first substrate includes a plurality of the photoelectric conversion elements; and the capacitor is configured to accumulate a charge transferred from at least one of the photoelectric conversion elements.

4. The electronic device according to claim 1, wherein the capacitor includes a plurality of trench capacitors.

5. A solid-state imaging device, comprising:
a first substrate including a photoelectric conversion element; and
a second substrate including a capacitor positioned on a side opposite to a surface of incidence of light to the photoelectric conversion element in the first substrate, and configured to accumulate a charge transferred from the photoelectric conversion element,
wherein the first substrate further includes a first copper electrode pad provided on a surface opposite to the surface of incidence,
wherein the second substrate further includes a second copper electrode pad provided on a surface opposed to the first substrate, and
wherein the first substrate and the second substrate are bonded to each other through bonding between the first copper electrode pad and the second copper electrode pad.

6. The solid-state imaging device according to claim 5, wherein the capacitor is a trench capacitor.

7. The solid-state imaging device according to claim 5, wherein:
the first substrate includes a plurality of the photoelectric conversion elements; and
the capacitor is configured to accumulate a charge transferred from at least one of the photoelectric conversion elements.

8. The solid-state imaging device according to claim 5, wherein the first substrate further includes a transfer transistor configured to control transfer of a charge from the photoelectric conversion element to the capacitor.

9. The solid-state imaging device according to claim 5, wherein the capacitor includes a plurality of trench capacitors.

10. The solid-state imaging device according to claim 9, wherein the trench capacitors are connected to one another in parallel.

11. The solid-state imaging device according to claim 5, wherein the second substrate further includes a pixel circuit including:
a reset transistor configured to control discharge of the charge accumulated in the capacitor;
an amplification transistor configured to cause, in a drain, a pixel signal of a voltage value that depends on a quantity of the charge accumulated in the capacitor; and
a selection transistor configured to switch connection between the drain of the amplification transistor and a predetermined wiring.

12. The solid-state imaging device according to claim 11, wherein the capacitor is connected between a gate of the amplification transistor and a ground.

13. The solid-state imaging device according to claim 11, further comprising a switch transistor with a source connected to a gate of the amplification transistor and a drain connected to a source of the reset transistor,
wherein the capacitor is connected between a ground and a node that connects the source of the reset transistor and the drain of the switch transistor to each other.

14. The solid-state imaging device according to claim 11, further comprising a third substrate positioned on a side opposite to a surface of the second substrate opposed to the first substrate,
wherein the third substrate includes a circuit element configured to execute predetermined processing for the pixel signal that has appeared in the predetermined wiring.

15. The solid-state imaging device according to claim 14, wherein the second substrate and the third substrate are bonded to each other by direct bonding.

16. The solid-state imaging device according to claim 14, wherein:
the second substrate includes a plurality of the pixel circuits;
the predetermined wiring includes a plurality of vertical signal lines provided for the pixel circuits on a one-to-one basis; and
the third substrate includes a plurality of the circuit elements provided for the vertical signal lines on a one-to-one basis.

17. The solid-state imaging device according to claim 14, wherein the circuit element includes a conversion circuit configured to convert the pixel signal that has appeared in the predetermined wiring into a digital value.

18. The solid-state imaging device according to claim 17, wherein the circuit element further includes a logic circuit configured to execute correlated double sampling processing for the pixel signal converted into the digital value by the conversion circuit.

19. The solid-state imaging device according to claim 14, wherein:
the second substrate includes a plurality of the pixel circuits; and
the drain of the amplification transistor of each of the pixel circuits is connected to the predetermined wiring via the selection transistor.

20. The solid-state imaging device according to claim 19, wherein
a plurality of the pixel circuits are arranged in a matrix form; and
the drain of the amplification transistor of each of the pixel circuits arranged in the same line among the pixel circuits arranged in the matrix form is connected to the common predetermined wiring via the selection transistor.

* * * * *